(12) United States Patent
Cheng et al.

(10) Patent No.: US 11,476,417 B2
(45) Date of Patent: Oct. 18, 2022

(54) PHASE CHANGE MEMORY AND METHOD OF FABRICATING THE SAME

(71) Applicants: Jiangsu Advanced Memory Technology Co., Ltd., Jiangsu (CN); Jiangsu Advanced Memory Semiconductor Co., Ltd., Jiangsu (CN)

(72) Inventors: Sheng-Hung Cheng, Hsinchu County (TW); Ming-Feng Chang, Hsinchu County (TW); Tzu-Hao Yang, Hsinchu County (TW)

(73) Assignees: JIANGSU ADVANCED MEMORY TECHNOLOGY CO., LTD., Jiangsu (CN); JIANGSU ADVANCED MEMORY SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 16/988,734

(22) Filed: Aug. 10, 2020

(65) Prior Publication Data

US 2020/0373483 A1   Nov. 26, 2020

Related U.S. Application Data

(63) Continuation of application No. 16/423,184, filed on May 28, 2019, now Pat. No. 10,811,607.

(30) Foreign Application Priority Data

Mar. 18, 2019 (CN) ......................... 201910202172.X

(51) Int. Cl.
   *H01L 27/24* (2006.01)
   *H01L 45/00* (2006.01)

(52) U.S. Cl.
   CPC ........ *H01L 45/126* (2013.01); *H01L 27/2436* (2013.01); *H01L 45/06* (2013.01);
   (Continued)

(58) Field of Classification Search
   CPC ..... H01L 45/06; H01L 45/126; H01L 45/144; H01L 45/148; H01L 45/1233; H01L 45/1683; H01L 27/2436
   (Continued)

(56) References Cited

U.S. PATENT DOCUMENTS

| 9,472,759 | B1 * | 10/2016 | Su | ....................... H01L 45/1233 |
| 2006/0073631 | A1 * | 4/2006 | Karpov | ................. H01L 45/126 438/102 |

(Continued)

FOREIGN PATENT DOCUMENTS

CN          105428525 B  *  3/2018   ......... H01L 27/2463

*Primary Examiner* — Igwe U Anya
(74) *Attorney, Agent, or Firm* — CKC & Partners Co., LLC

(57) ABSTRACT

A phase change memory and a method of fabricating the same are provided. The phase change memory includes a lower electrode, an annular heater disposed over the lower electrode, an annular phase change layer disposed over the annular heater, and an upper electrode. The annular phase change layer and the annular heater are misaligned in a normal direction of the lower electrode. The upper electrode is disposed over the annular phase change layer, in which the upper electrode is in contact with an upper surface of the annular phase change layer. The present disclosure simplifies the manufacturing process of the phase change memory, reduces the manufacturing cost, and improves the manufacturing yield. In addition, a contact surface between the heater and the phase change layer of the phase change memory of the present disclosure is very small, so that the phase change memory has an extremely low reset current.

15 Claims, 28 Drawing Sheets

(52) U.S. Cl.
CPC ...... *H01L 45/1233* (2013.01); *H01L 45/1683* (2013.01); *H01L 45/144* (2013.01); *H01L 45/148* (2013.01)

(58) Field of Classification Search
USPC .......................................................... 257/4
See application file for complete search history.

(56) References Cited

U.S. PATENT DOCUMENTS

| | | | |
|---|---|---|---|
| 2006/0175597 A1* | 8/2006 | Happ | H01L 45/148 257/2 |
| 2007/0069249 A1 | 3/2007 | Hayakawa | |
| 2007/0097738 A1* | 5/2007 | Asano | H01L 45/122 365/163 |
| 2007/0152205 A1* | 7/2007 | Chen | H01L 45/124 257/4 |
| 2008/0237565 A1* | 10/2008 | Chang | H01L 27/2463 257/4 |

* cited by examiner

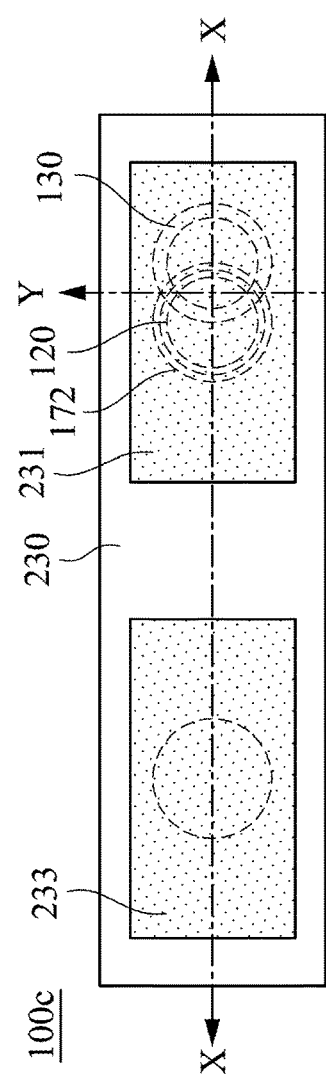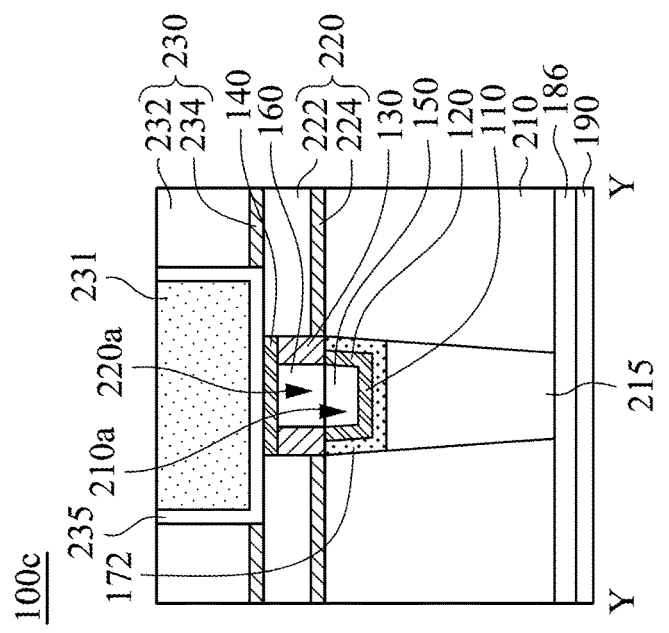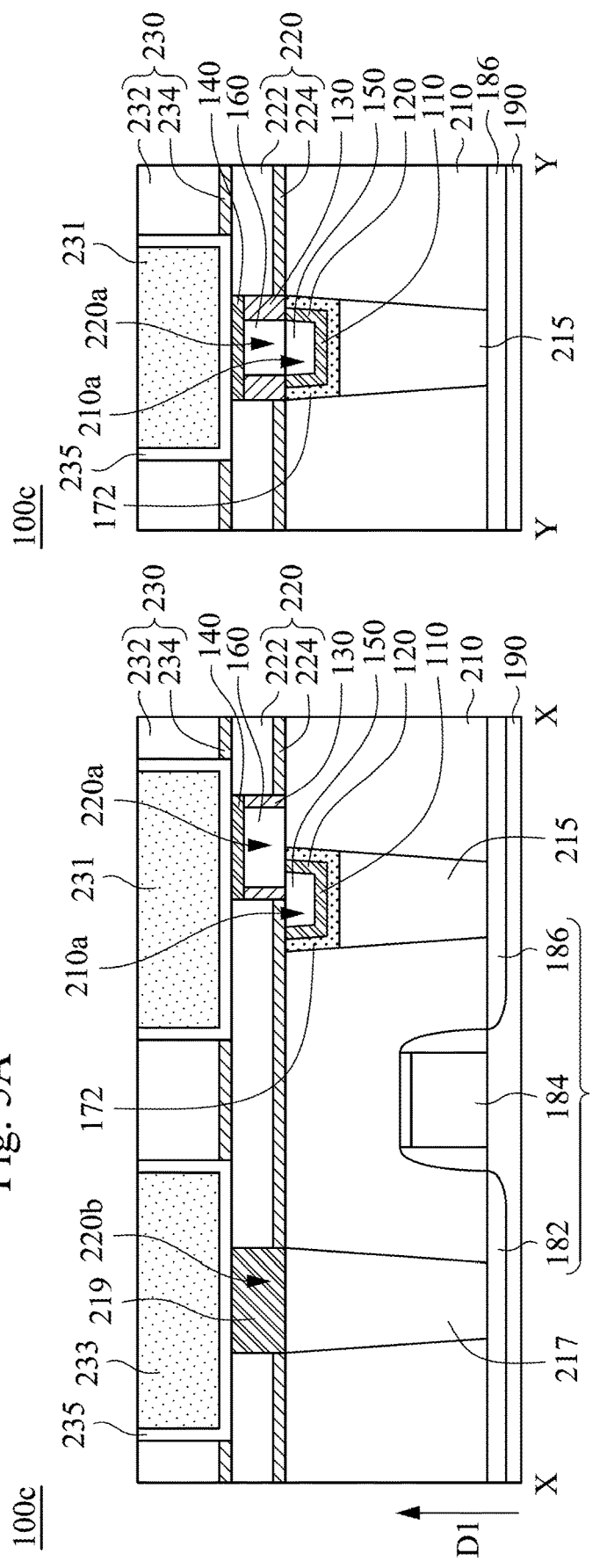

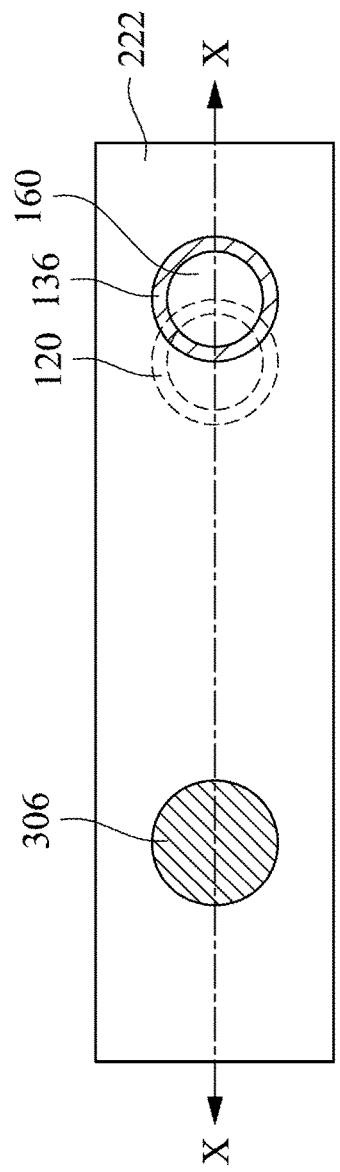
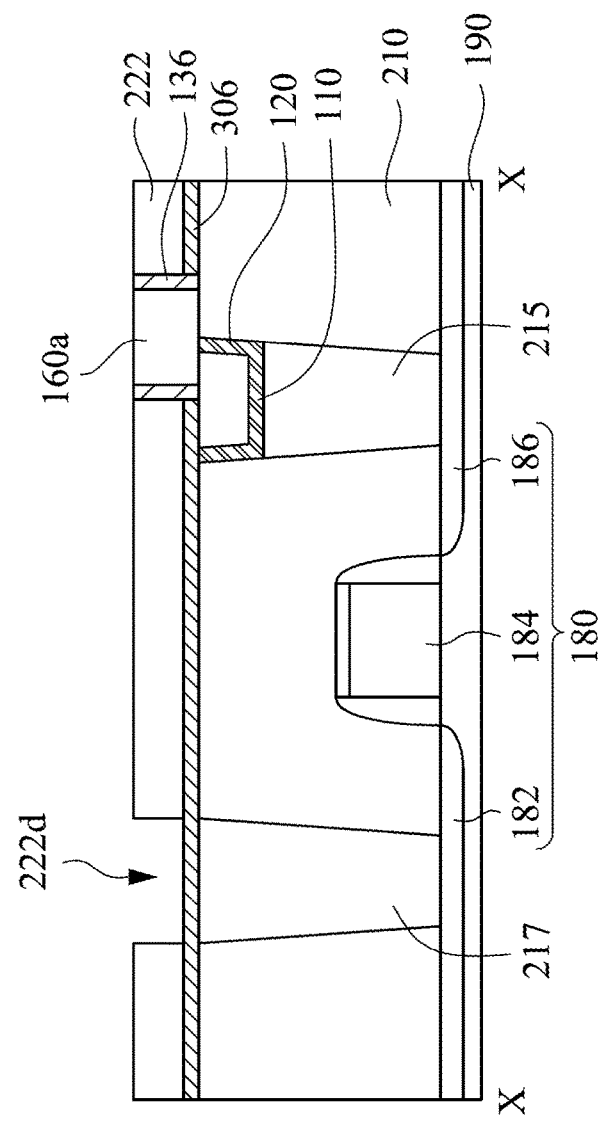

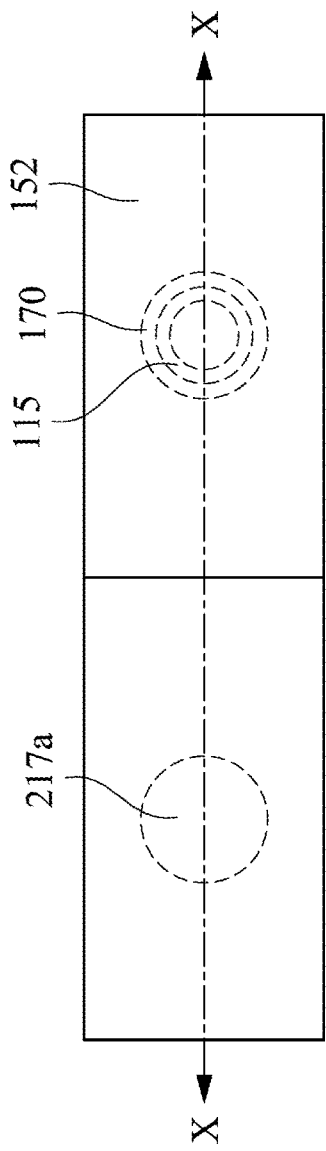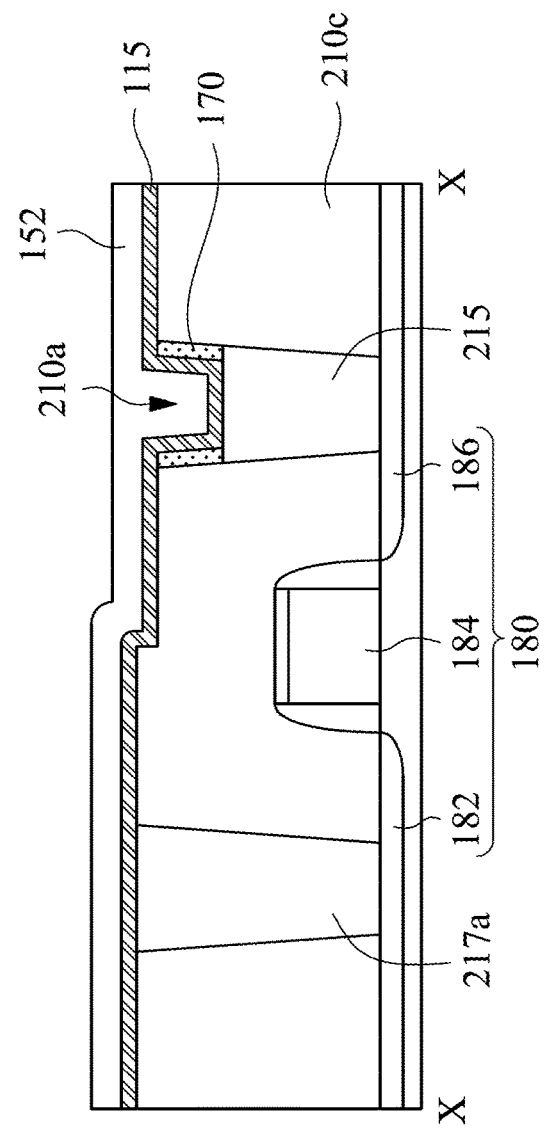
Fig. 25A
Fig. 25B

PHASE CHANGE MEMORY AND METHOD OF FABRICATING THE SAME

CROSS-REFERENCE TO RELATED APPLICATION

The application is a Continuation Application of the U.S. application Ser. No. 16/423,184, filed on May 28, 2019, which claims priority to China Application Serial Number 201910202172.X, filed on Mar. 18, 2019, all of which are herein incorporated by reference in their entireties.

BACKGROUND

Field of Invention

The present disclosure relates to a phase change memory and a method of fabricating the phase change memory.

Description of Related Art

Electronic products, such as cell phones, tablets, and digital cameras, often have memory elements that store data. The conventional memory element can store data through a storage node on the memory cell. Among them, the phase change memory utilizes the electrical resistance state (e.g., high resistance and low resistance) of the memory element to store data. The memory element can have a material that can be switched between different phase states (e.g., a crystalline phase and an amorphous phase). The different phase states cause the memory cell to have electrical resistance states of different electrical resistance values, which are used to represent different values of stored data.

When the phase change memory is in operation, a current can be applied to cause temperature of the memory element to rise to change the phase state of the material. The heater of the conventional phase change memory element has a large contact area with a memory element coupled thereto, which will increase surface hole defect, and rates of the temperature rise and fall are also slow (the conversion between high resistance and low resistance value is not fast enough), and an amount of current required is also large. In addition, the process of manufacturing a heater having a small contact area using conventional technology requires a precise alignment mechanism, which results in a complicated process and is difficult to control, and relatively increases the manufacturing cost of the phase change memory. Therefore, there is a need in the industry for a novel and efficient process for fabricating a phase change memory.

SUMMARY

One aspect of the present disclosure is to provide a phase change memory including a lower electrode, an annular heater, an annular phase change layer, and an upper electrode. The annular heater is disposed over the lower electrode. The annular phase change layer is disposed over the annular heater, and the annular phase change layer and the annular heater are misaligned in a normal direction of the lower electrode. The upper electrode is disposed over the annular phase change layer, in which the upper electrode is in contact with an upper surface of the annular phase change layer.

In an embodiment of the present disclosure, the lower electrode is integrally formed with the annular heater.

In an embodiment of the present disclosure, the phase change memory further includes a flat layer, in which the annular heater has a hollow portion, and the flat layer is filled in the hollow portion, and an upper surface of the flat layer is coplanar with an upper surface of the annular heater.

In an embodiment of the present disclosure, the flat layer has an electrical resistance higher than an electrical resistance of the annular heater.

In an embodiment of the present disclosure, the phase change memory further includes an annular spacer surrounding an outer side of the annular heater, and an upper surface of the annular spacer is coplanar with an upper surface of the annular heater.

In an embodiment of the present disclosure, the phase change memory further includes a barrier layer covering a bottom of the lower electrode and an outer side surface of the annular heater, and an upper surface of the barrier layer is coplanar with an upper surface of the annular heater.

In an embodiment of the present disclosure, the barrier layer has an electrical resistance higher than an electrical resistance of the annular heater.

In an embodiment of the present disclosure, the phase change memory further includes a filling layer, in which the annular phase change layer has a hollow portion, and the filling layer is filled in the hollow portion, and an upper surface of the filling layer is coplanar with the upper surface of the annular phase change layer.

In an embodiment of the present disclosure, a material of the filling layer is an alloy material having a higher electrical resistance than the annular phase change layer.

Another aspect of the present disclosure is to provide a method of fabricating a phase change memory, including: (i) providing a precursor structure, in which the precursor structure includes a first dielectric layer having a first opening; (ii) forming a lower electrode and an annular heater in the first opening, in which the annular heater is disposed over the lower electrode; (iii) forming an annular phase change layer over the annular heater, in which the annular phase change layer and the annular heater are misaligned in a normal direction of the lower electrode; and (iv) forming an upper electrode over the annular phase change layer, in which the upper electrode is in contact with an upper surface of the annular phase change layer.

In an embodiment of the present disclosure, the operation of forming the lower electrode and the annular heater includes: forming a conductive material over the first dielectric layer, and a sidewall and a lower surface of the first opening; and performing a chemical-mechanical polishing process to remove the conductive material over the first dielectric layer and an upper portion of the first dielectric layer to form the lower electrode and the annular heater.

In an embodiment of the present disclosure, before the operation of forming the lower electrode and the annular heater, the method further includes forming an annular spacer over a sidewall of the first opening.

In an embodiment of the present disclosure, before the operation of forming the lower electrode and the annular heater, the method further includes forming a barrier layer over a bottom and a sidewall of the first opening.

In an embodiment of the present disclosure, the lower electrode is integrally formed with the annular heater.

In an embodiment of the present disclosure, before the operation of forming the annular phase change layer, the method further includes forming a flat layer in a remaining portion of the first opening.

In an embodiment of the present disclosure, the operation of forming the annular phase change layer includes: forming a second dielectric layer having a second opening over the annular heater; and forming the annular phase change layer in the second opening.

In an embodiment of the present disclosure, the operation of forming the annular phase change layer in the second opening includes: forming a phase change layer material over the second dielectric layer, and a sidewall and a lower surface of the second opening; and performing an etching process to remove the phase change layer material over the second dielectric layer and the phase change layer material over the lower surface of the second opening to form the annular phase change layer.

In an embodiment of the present disclosure, before the operation of forming the upper electrode, the method further includes forming a dielectric layer in a remaining portion of the second opening.

As can be seen from the above embodiments, the present disclosure provides a phase change memory. In the manufacturing process of the phase change memory, the annular heater and the annular phase change layer do not need to be precisely aligned, and the contact area between the annular heater and the annular phase change layer can be reduced by misaligning the two. That is, the present disclosure simplifies the manufacturing process of the phase change memory, reduces the manufacturing cost, and improves the manufacturing yield. In addition, the contact area between the heater and the phase change layer of the phase change memory of the present disclosure is very small, so that the phase change memory has an extremely low reset current thus to effectively solve the problems described in the prior art.

The above description will be described in detail in the following embodiments, and further explanation of the technical solutions of the present disclosure will be provided.

BRIEF DESCRIPTION OF THE DRAWINGS

The various aspects of the present disclosure can be better understood from the following detailed description and the figures. It should be noted that, in accordance with standard practice in the industry, various features are not drawn to scale. In fact, the dimensions of multiple features can be arbitrarily increased or decreased to make the description clear.

FIG. 5A is a top view of a phase change memory according to other embodiments of the present disclosure;

FIGS. 5B and 5C are cross-sectional views of the phase change memory taken along line X-X and line Y-Y of FIG. 5A, respectively;

FIGS. 7A-23A are top views of various stages of a method of fabricating a phase change memory according to some embodiments of the present disclosure;

FIGS. 7B-23B are cross-sectional views of intermediate structures taken along line X-X of FIGS. 7A-23A, respectively;

FIGS. 24A-26A are top views of various stages of a method of fabricating a phase change memory according to other embodiments of the present disclosure;

FIGS. 24B-26B are cross-sectional views of intermediate structures taken along line X-X of FIGS. 24A-26A, respectively;

FIGS. 27A-28A are top views of various stages of a method of fabricating a phase change memory according to other embodiments of the present disclosure; and FIGS. 27B-28B are cross-sectional views showing intermediate structures taken along line X-X of FIGS. 27A-28A, respectively.

DETAILED DESCRIPTION

Figure 1A:
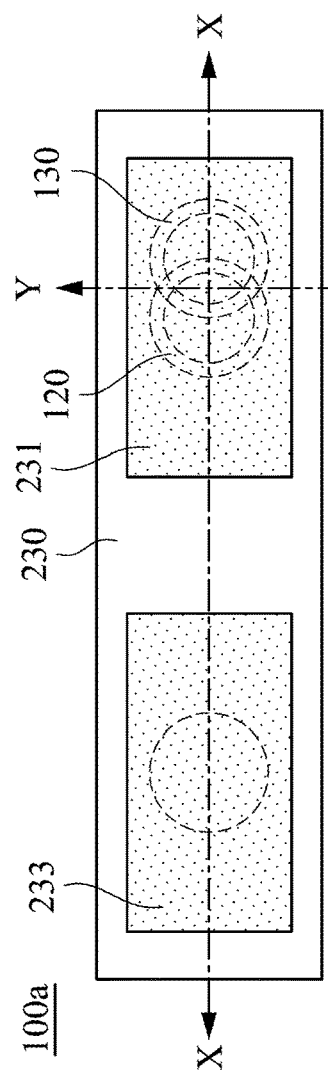
FIG. 1A is a top view of a phase change memory according to some embodiments of the present disclosure.

The following disclosure provides many different embodiments or examples for implementing different features of the subject matter provided. Specific examples of components and arrangements are described below to simplify the disclosure. These are merely examples and are not intended to limit the disclosure. For example, forming a first feature over a second feature or on a second feature in a subsequent description may include an embodiment of forming the first feature and the second feature that are in direct contact, and may also include an embodiment of forming an additional feature between the first and second features such that the first and second features are not in direct contact. In addition, in each example of the present disclosure, element reference numerals and/or letters may be repeated. This repetition is for the purpose of simplification and clarity, and is not intended to indicate the relationship between the various embodiments and/or constructions discussed.

In addition, spatially relative terms, such as "beneath", "under", "lower", "over", "upper", and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptions used herein may likewise be interpreted accordingly.

Figure 1C:
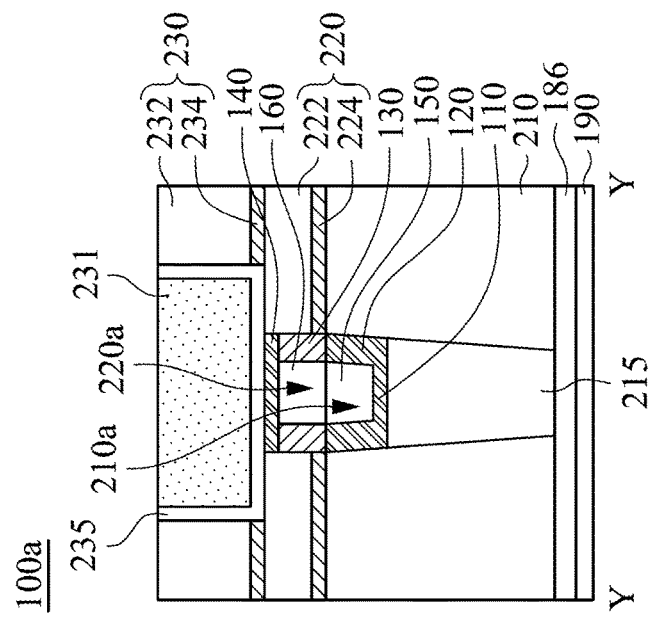
FIGS. 1B and 1C are cross-sectional views of the phase change memory taken along line X-X and line Y-Y of FIG. 1A, respectively.
Figure 1B:
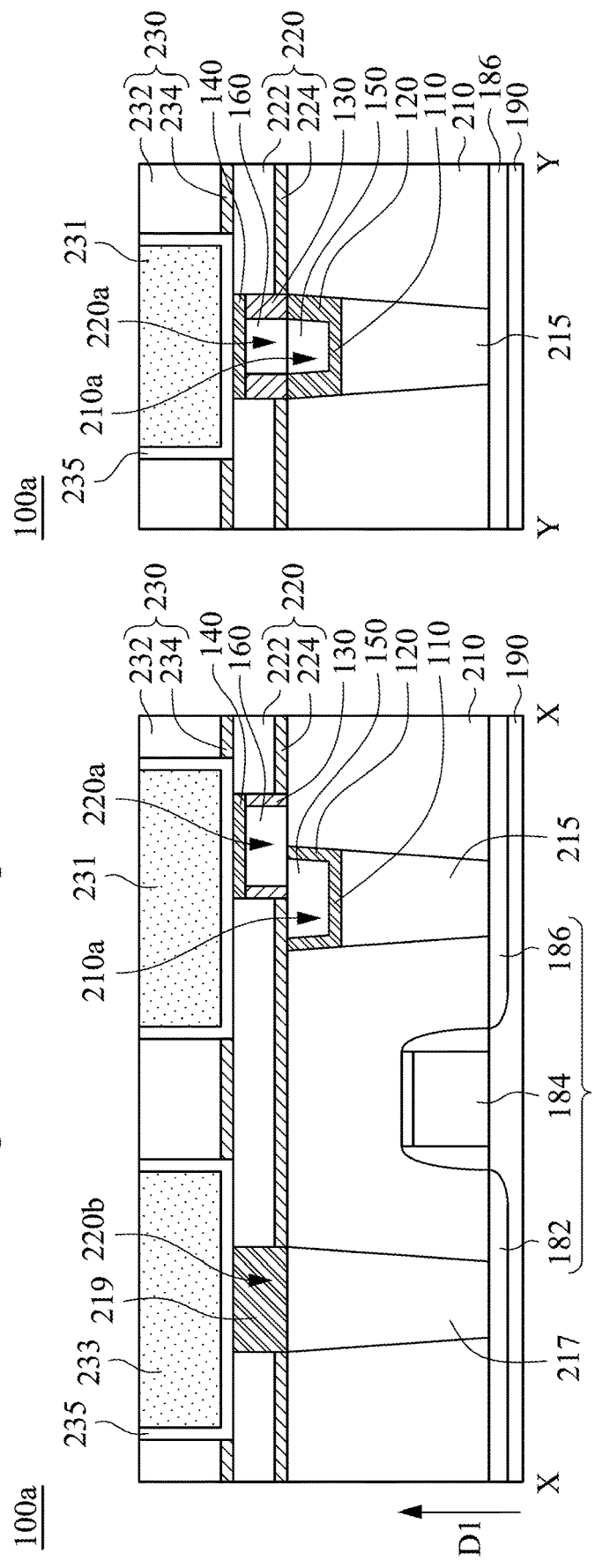

FIG. 1A is a top view of a phase change memory 100a according to some embodiments of the present disclosure. FIGS. 1B and 1C are cross-sectional views of the phase change memory 100a taken along line X-X and line Y-Y of FIG. 1A, respectively. As shown in FIGS. 1A-1C, the phase change memory 100a includes an active device 180, a lower electrode 110, an annular heater 120, an annular phase change layer 130, and an upper electrode 140. The active device 180 is disposed over a substrate 190. In the present embodiment, the active device 180 is a transistor including a source 182, a drain 186, and a gate 184.

The phase change memory 100a further has a dielectric layer 210 which is disposed over the substrate 190 and covers the active device 180. In addition, the dielectric layer 210 further has a plurality of conductive contacts 215, 217. The conductive contacts 215, 217 are respectively disposed over and in contact with the drain 186 and the source 182 for connection to the active device 180 in the substrate 190. The lower electrode 110 is disposed over the conductive contact 215 to be coupled to the active device 180 through the conductive contact 215. The drain 186 and the source 182 are symmetric, and those are determined by the magnitude of the voltage of the active device 180. Names of the drain 186 and the source 182 may be interchanged according to the magnitude of the voltage.

Figure 2:
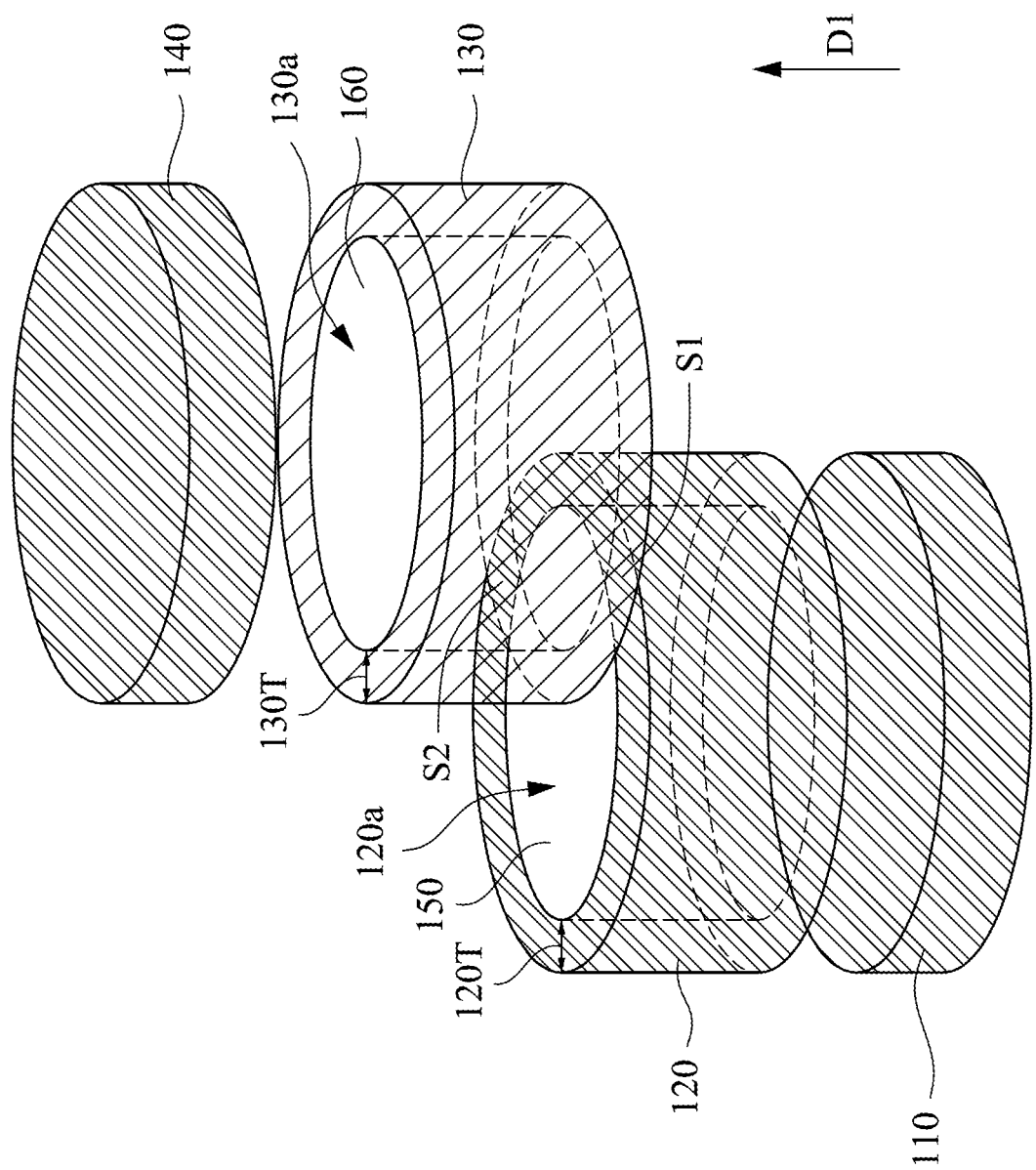
FIG. 2 is a perspective view of a partial structure of the phase change memory of FIGS. 1A-1C.

Please simultaneously refer to FIG. 2. FIG. 2 is a perspective view of a partial structure of the phase change memory 100a of FIGS. 1A-1C. As shown in FIG. 2, the annular heater 120 is disposed over the lower electrode 110 and has a thickness 120T. The thickness 120T is the difference between an outer circle radius and an inner circle radius of the annular heater 120. It should be understood that the thickness 120T of the annular heater 120 will determine its contact area with the annular phase change layer 130, so that the smaller the thickness 120T, the better. In some embodiments of the present disclosure, the thickness 120T of the annular heater 120 is between 5 and 30 nanometers. In some embodiments of the present disclosure, the annular heater 120 includes titanium, titanium nitride, tantalum nitride, titanium aluminum nitride, tantalum aluminum nitride, or a combination thereof.

In some embodiments, the lower electrode 110 is integrally formed with the annular heater 120. Specifically, the dielectric layer 210 has an opening 210a (as shown in FIG. 1B), and the lower electrode 110 and the annular heater 120 are formed by filling a conductive material over sidewalls and a bottom of the opening 210a. In some embodiments of the present disclosure, the lower electrode 110 includes titanium, titanium nitride, tantalum nitride, titanium aluminum nitride, tantalum aluminum nitride, or a combination thereof.

The annular phase change layer 130 is disposed over the annular heater 120 and in contact with the annular heater 120. The annular phase change layer 130 has a thickness 130T. The thickness 130T is the difference between an outer circle radius and an inner circle radius of the annular phase change layer 130. It should be understood that the thickness 130T of the annular phase change layer 130 will determine its contact area with the annular heater 120, so the smaller the thickness 130T, the better. In some embodiments of the present disclosure, the thickness 130T of the annular phase change layer 130 is between 5 and 30 nanometers. In some embodiments of the present disclosure, the annular phase change layer 130 includes germanium-antimony-tellurium ($Ge_2Sb_2Te_5$, $Ge_3Sb_6Te_5$, GST), nitrogen-doped germanium-antimony-tellurium (nitrogen-doped $Ge_2Sb_2Te_5$), antimony telluride ($Sb_2Te$), germanium-antimony (GeSb), indium-doped antimony telluride (In-doped $Sb_2Te$) or a combination thereof.

As shown in FIG. 2, the annular phase change layer 130 and the annular heater 120 are misaligned in a normal direction D1 of the lower electrode 110. Therefore, the annular phase change layer 130 and the annular heater 120 have two contact regions S1, S2. As mentioned above, in the current manufacturing process of the phase change memory, a precise alignment mechanism between the heater and the phase change layer is required, resulting in a complicated process, high cost, and low yield. However, the phase change memory 100a disclosed herein has the advantages of simple process, low cost, and high heating efficiency compared to the difficulties encountered by the prior art described above. Specifically, the annular phase change layer 130 is misaligned with the annular heater 120, and those are in contact at the intersection, thereby greatly reducing areas of the contact regions S1, S2, in which area sizes of the contact regions S1, S2 are positively correlated with the thickness 120T and the thickness 130T. As such, the contact area between the annular phase change layer 130 and the annular heater 120 can be effectively reduced without using a complicated alignment or etching mechanism, thereby improving the heating efficiency.

The upper electrode 140 is disposed over the annular phase change layer 130 and in contact with an upper surface of the annular phase change layer 130. In some embodiments of the present disclosure, the upper electrode 140 includes titanium, titanium nitride, tantalum nitride, titanium aluminum nitride, tantalum aluminum nitride, or a combination thereof.

In some embodiments of the present disclosure, the phase change memory 100 further has a flat layer 150 and a filling layer 160. As shown in FIG. 2, the annular heater 120 has a hollow portion 120a, and the flat layer 150 is filled in the hollow portion 120a. Specifically, an upper surface of the annular heater 120 is coplanar with an upper surface of the flat layer 150. In some embodiments of the present disclosure, the flat layer 150 includes titanium, titanium nitride, tantalum nitride, titanium aluminum nitride, tantalum aluminum nitride, or a combination thereof. However, it should be noted that the conductivity of the flat layer 150 should be lower than that of the annular heater 120.

Similarly, the annular phase change layer 130 has a hollow portion 130a, and the filling layer 160 is filled in the hollow portion 130a. Specifically, an upper surface of the annular phase change layer 130 is coplanar with an upper surface of the filling layer 160, and the upper electrode 140 covers the annular phase change layer 130 and the filling layer 160, in which the upper electrode 140 is in contact with the upper surface of the annular phase change layer 130. In some embodiments of the present disclosure, the filling layer 160 includes oxide, nitride, oxynitride, or a combination thereof, such as silicon oxide, silicon nitride, silicon oxynitride, or a combination thereof.

As shown in FIG. 1B and FIG. 2, when the active device 180 supplies current to the lower electrode 110, the current sequentially passes through the lower electrode 110, the annular heater 120, and enters the annular phase change layer 130 from the contact regions S1 and S2, and finally arrives at the upper electrode 140. The annular phase change layer 130 is heated by ohmic heating, and is converted between the crystalline phase and the amorphous phase by controlling cooling rate, and thus different values of data can be stored.

In some embodiments of the present disclosure, the phase change memory 100a further includes a dielectric layer 220 and a conductive contact 219. Specifically, the dielectric layer 220 covers the dielectric layer 210 and has an opening 220a and an opening 220b. The opening 220b exposes the conductive contact 217, and the opening 220a exposes a portion of the annular heater 120 and a portion of the flat layer 150. In more detail, the opening 220a and the opening 210a are misaligned in the direction D1, and the annular phase change layer 130 is disposed over the sidewalls of the opening 220a and in contact with and electrically connected to the annular heater 120. The conductive contact 219 is filled in the opening 220b to be electrically connected to the conductive contact 217.

In some embodiments of the present disclosure, the dielectric layer 220 can be a single layer or a multilayer structure. In some embodiments, the dielectric layer 220 includes oxide, nitride, oxynitride, or a combination thereof, such as silicon oxide, silicon nitride, silicon oxynitride, or a combination thereof. For example, in one embodiment, the dielectric layer 220 includes an upper dielectric layer 222 and a lower dielectric layer 224, in which the lower dielectric layer 224 is nitride and the upper dielectric layer 222 is oxide, but not limited thereto.

In some embodiments of the present disclosure, the phase change memory 100a further includes a dielectric layer 230 and a plurality of metal connection lines 231, 233. Specifically, the dielectric layer 230 is disposed over the dielectric layer 220, and the metal connection lines 231 and 233 are embedded in the dielectric layer 230 and respectively electrically connected to the upper electrode 140 and the conductive contact 219.

In some embodiments of the present disclosure, the dielectric layer 230 can be a single layer or a multilayer structure. In some embodiments, the dielectric layer 230 includes oxide, nitride, oxynitride, nitrogen-doped carbide, or a combination thereof, such as silicon oxide, silicon nitride, silicon oxynitride, nitrogen-doped silicon carbide, or a combination thereof. For example, in one embodiment, the dielectric layer 230 includes an upper dielectric layer 232 and a lower dielectric layer 234, in which the lower dielectric layer 234 is nitrogen-doped carbide, and the upper dielectric layer 232 is oxide, but not limited thereto.

In some embodiments of the present disclosure, the conductive contacts 215, 217, 219 and/or metal connection lines 231, 233 described above include a metal, a metal compound, or a combination thereof, such as titanium, tantalum, tungsten, aluminum, copper, molybdenum, platinum, titanium nitride, tantalum nitride, tantalum carbide, tantalum silicon nitride, tungsten nitride, molybdenum nitride, molybdenum oxynitride, lanthanum oxide, titanium aluminum, titanium aluminum nitride, tantalum carbonitride, other suitable materials, or a combination thereof.

In some embodiments of the present disclosure, the phase change memory 100a further includes a barrier layer 235. The barrier layer 235 is disposed between the upper electrode 140 and the metal connection line 231, and between the conductive contact 219 and the metal connection line 233. It should be understood that the barrier layer 235 is configured to prevent metal ions of the metal connection lines 231, 233 from diffusing or penetrating into underlying layers (i.e., the upper electrode 140 or the conductive contact 219) to cause contamination. In some embodiments, the barrier layer 235 includes titanium, tantalum, titanium nitride, tantalum nitride, tantalum carbide, tantalum silicon nitride, other suitable materials, or a combination thereof.

Figure 3A:
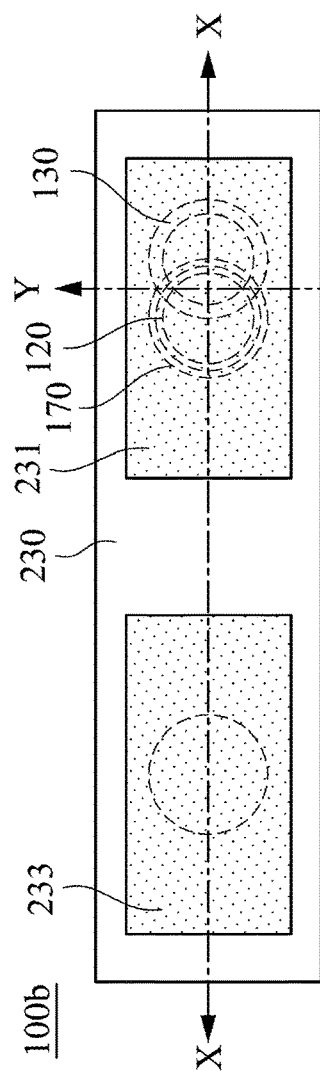
FIG. 3A is a top view of a phase change memory according to other embodiments of the present disclosure.
Figure 3C:
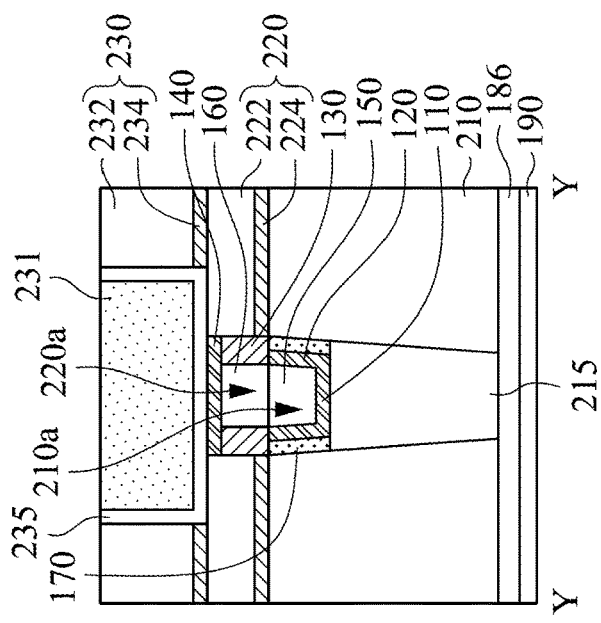
FIGS. 3B and 3C are cross-sectional views of the phase change memory taken along line X-X and line Y-Y of FIG. 3A, respectively.
Figure 3B:
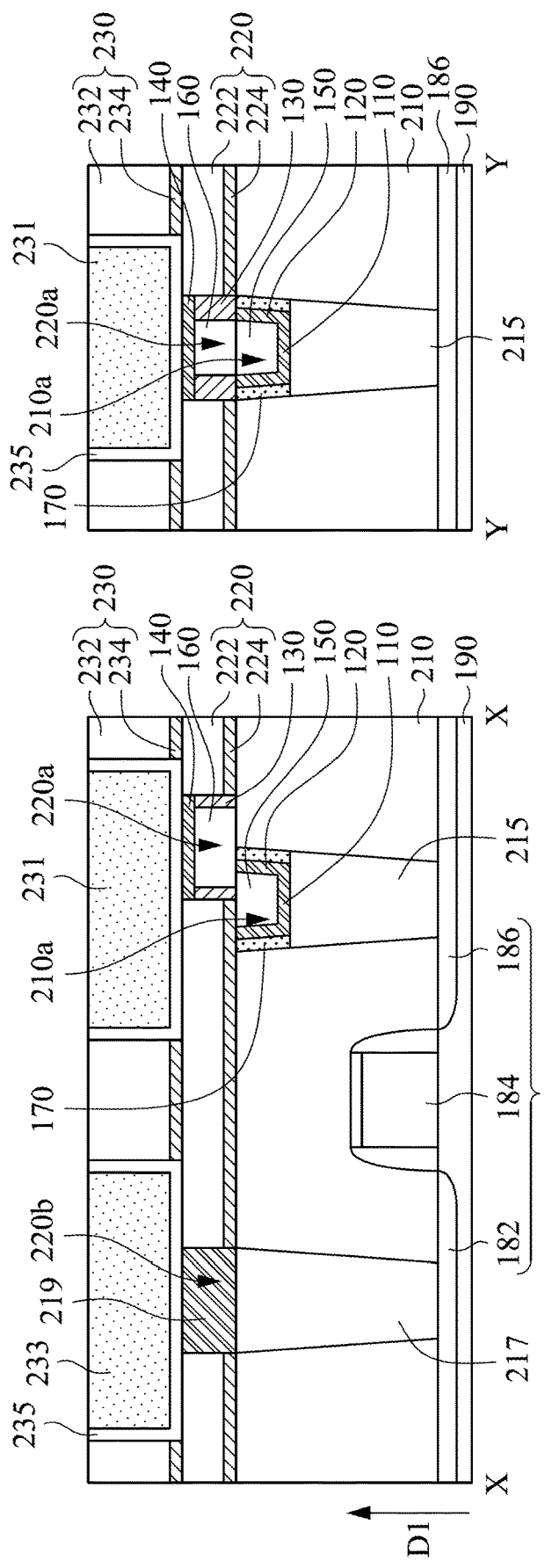

FIG. 3A is a top view of a phase change memory 100b according to other embodiments of the present disclosure. FIGS. 3B and 3C are cross-sectional views of the phase change memory 100b taken along line X-X and line Y-Y of FIG. 3A, respectively. It should be noted that, as shown in FIGS. 3A-3C, the same or similar elements as those in FIGS. 1A-1C are denoted by the same reference numerals, and the description thereof will be omitted. The phase change memory 100b of FIGS. 3A-3C is similar to the phase change memory 100a of FIGS. 1A-1C except that the phase change memory 100b further includes an annular spacer 170.

Figure 4:
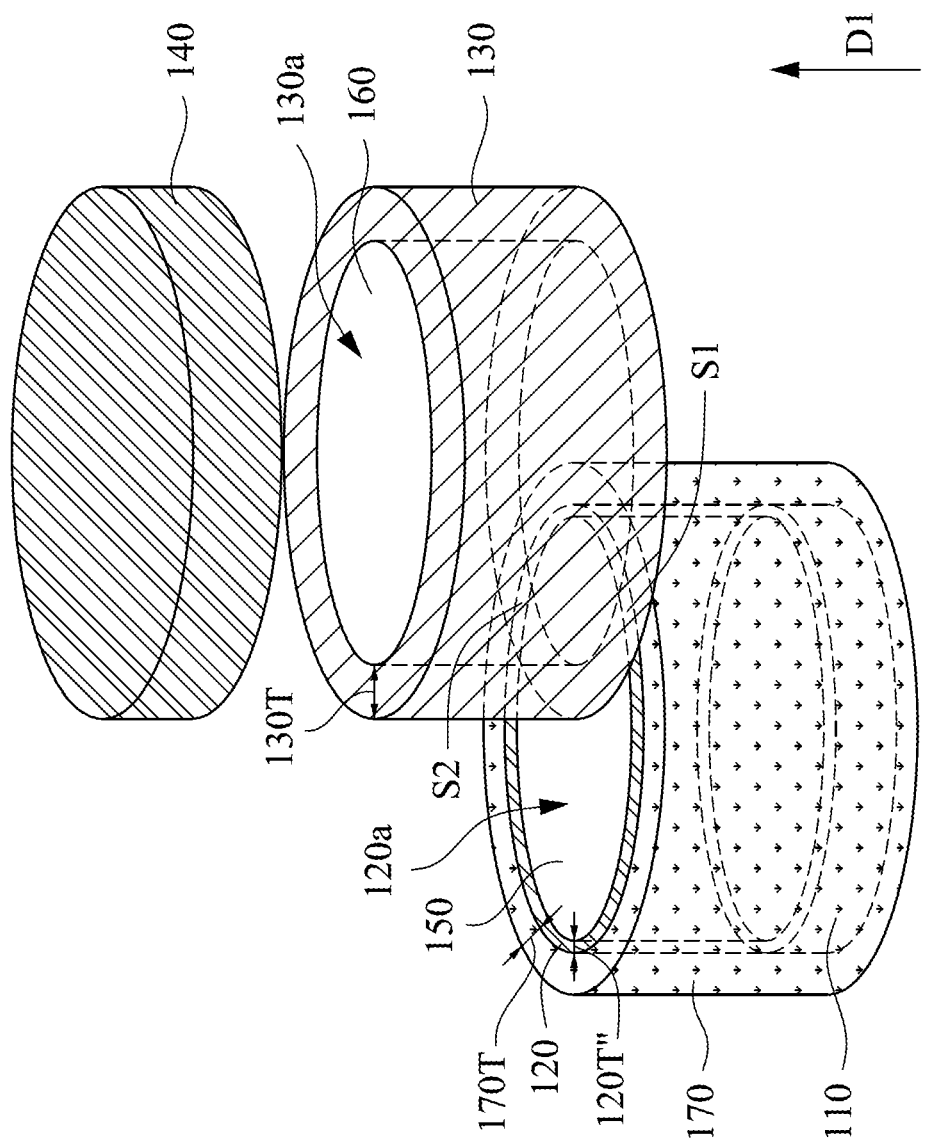
FIG. 4 is a perspective view of a partial structure of the phase change memory of FIGS. 3A-3C.

Please simultaneously refer to FIG. 4. FIG. 4 is a perspective view of a partial structure of the phase change memory 100b of FIGS. 3A-3C. As shown in FIG. 4, the annular spacer 170 surrounds the annular heater 120 and the lower electrode 110. Specifically, the annular spacer 170 is disposed between the sidewall of the opening 210a of the dielectric layer 210 and the annular heater 120 (as shown in FIGS. 3B and 3C).

As described above, if the contact area between the heater and the phase change layer is smaller, the current density can be increased, thereby increasing the switching speed between the phase states in the phase change layer and reducing the power consumption. In the phase change memory 100b, the annular spacer 170 is configured to reduce the contact area between the annular heater 120 and the annular phase change layer 130. Specifically, the annular spacer 170 is firstly formed over the sidewalls of the opening 210a, such that the subsequently formed annular heater 120 has a reduced thickness 120T" (as shown in FIG. 4). Since area sizes of the contact regions S1, S2 of the annular phase change layer 130 and the annular heater 120 are positively correlated with the thickness 120T", reducing the thickness 120T" of the annular heater 120 can reduce the area sizes of the contact regions S1, S2. Accordingly, the heating efficiency of the phase change memory 100b is improved. In some embodiments, the annular spacer 170 has a thickness 170T between 3 and 20 nanometers.

FIG. 5A is a top view of a phase change memory 100c according to other embodiments of the present disclosure. FIGS. 5B and 5C are cross-sectional views of the phase change memory 100c taken along line X-X and line Y-Y of FIG. 5A, respectively. It should be noted that, as shown in FIGS. 5A-5C, the same or similar elements as those in FIGS. 1A-1C are denoted by the same reference numerals, and the description thereof will be omitted. The phase change memory 100c of FIGS. 5A-5C is similar to the phase change memory 100a of FIGS. 1A-1C except that the phase change memory 100b further includes a barrier layer 172.

Figure 6:
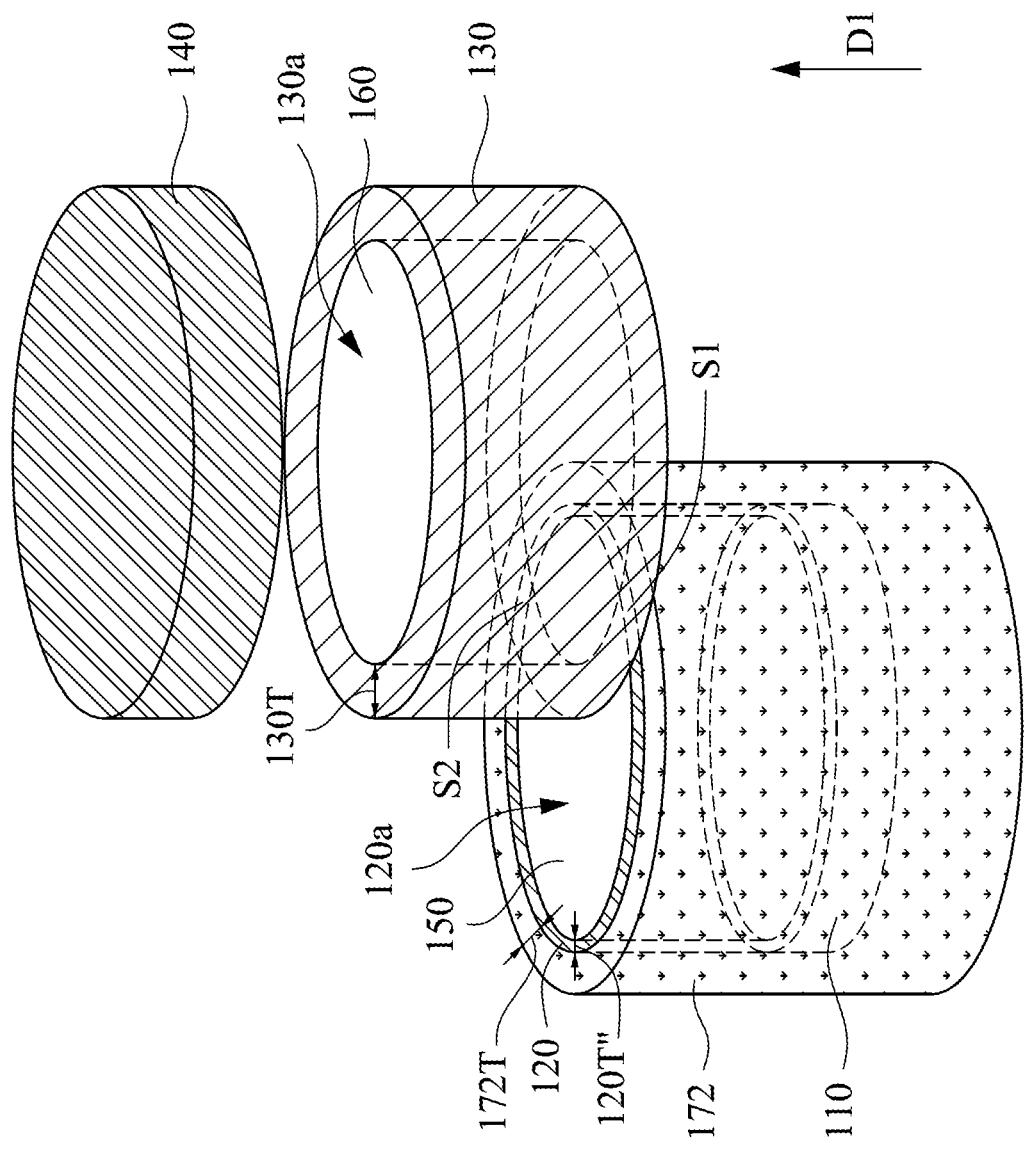
FIG. 6 is a perspective view of a partial structure of the phase change memory of FIGS. 5A-5C.

Please simultaneously refer to FIG. 6. FIG. 6 is a perspective view of a partial structure of the phase change memory 100c of FIGS. 5A-5C. As shown in FIG. 6, the barrier layer 172 covers a bottom of the lower electrode 110 and an outer side surface of the annular heater 120. Specifically, the barrier layer 172 is disposed between sidewalls, a bottom surface of the opening 210a of the dielectric layer 210 and the annular heater 120 as well as the lower electrode 110 (as shown in FIGS. 5B and 5C). It should be noted that the electrical resistance value of the barrier layer 172 should be higher than that of the annular heater 120.

In the phase change memory 100c, the barrier layer 172 is configured to reduce the contact area between the annular heater 120 and the annular phase change layer 130. Specifically, the barrier layer 172 is firstly formed over the sidewalls and the bottom surface of the opening 210a, so that the subsequently formed annular heater 120 has a reduced thickness 120T" (as shown in FIG. 6). Therefore, the thickness 120T" of the annular heater 120 is reduced, and the area sizes of the contact regions S1, S2 are also reduced. As such, the heating efficiency of the phase change memory 100c is improved. In some embodiments, the barrier layer 172 has a thickness 172T between 3 and 20 nanometers.

In addition, the barrier layer 172 is configured to prevent oxygen atoms or other impurities of the dielectric layer (e.g., the dielectric layer 210) around the annular heater 120 from diffusing into the annular heater 120 when the phase change memory 100c is in operation and thus changing its electrical resistance characteristics.

The present disclosure also provides a method of fabricating the phase change memory 100a (shown in FIGS. 1A-1C). FIGS. 7A-23A are top views of various stages of a method of fabricating the phase change memory 100a according to some embodiments of the present disclosure. FIGS. 7B-23B are cross-sectional views of intermediate structures taken along line X-X of FIGS. 7A-23A, respectively.

Figure 7A:
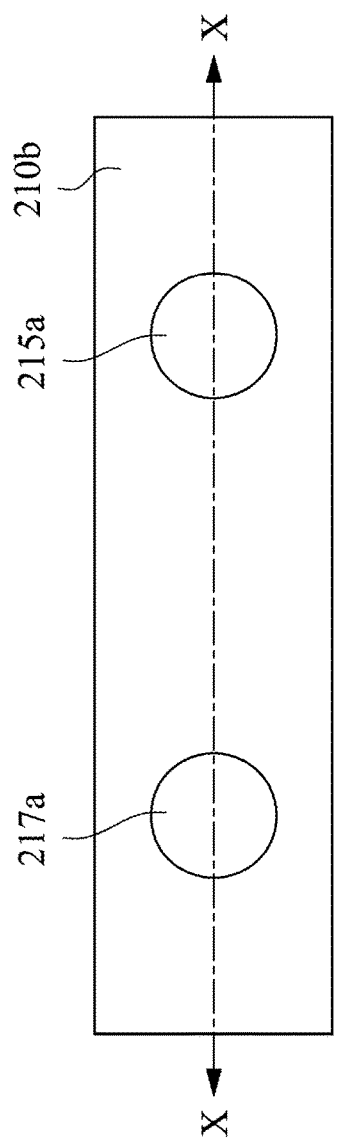
Figure 7B:
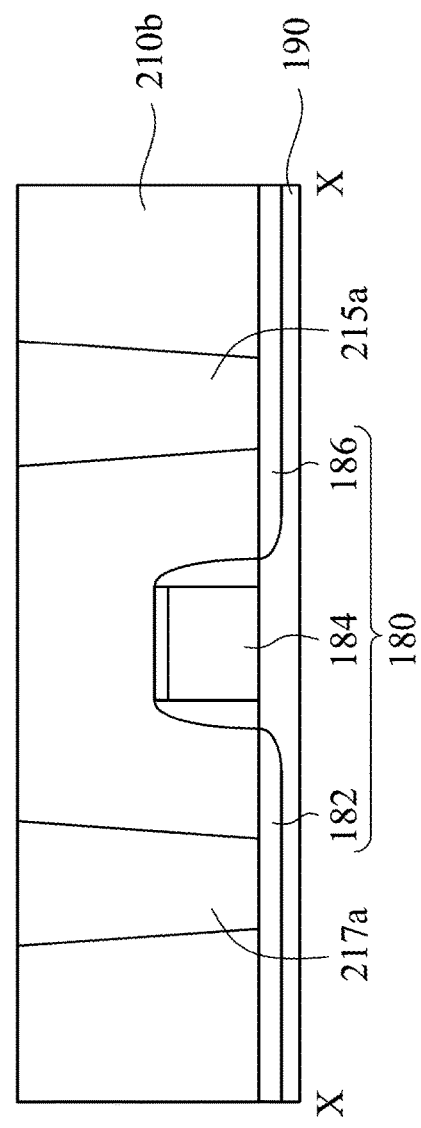

Please refer to FIG. 7A and FIG. 7B first. A substrate 190 is firstly provided, and an active device 180 is formed over the substrate 190. The active device 180 includes a source 182, a drain 186, and a gate 184. The forming technique of the active device 180 includes conventional semiconductor processing techniques and will not be described herein.

After the active device 180 is formed, as shown in FIGS. 7A and 7B, a dielectric layer 210b is formed covering the active device 180 and the substrate 190. The dielectric layer 210b has a plurality of through holes exposing the source 182 and the drain 186 of the active device 180. In some embodiments of the present disclosure, the dielectric layer 210b is formed by using chemical vapor deposition or other suitable thin film deposition techniques, and the through holes of the dielectric layer 210b are formed by using a lithography and etching process, a laser drilling process, or other suitable processes.

After the through holes are formed, as shown in FIGS. 7A and 7B, conductive contacts 215a, 217a are formed in the through holes to be coupled with the active device 180. In some embodiments of the present disclosure, the manner in which the conductive contacts 215a, 217a are formed includes chemical vapor deposition, physical vapor deposition, atomic layer deposition, spin coating processes, or other suitable processes.

Figure 8A:
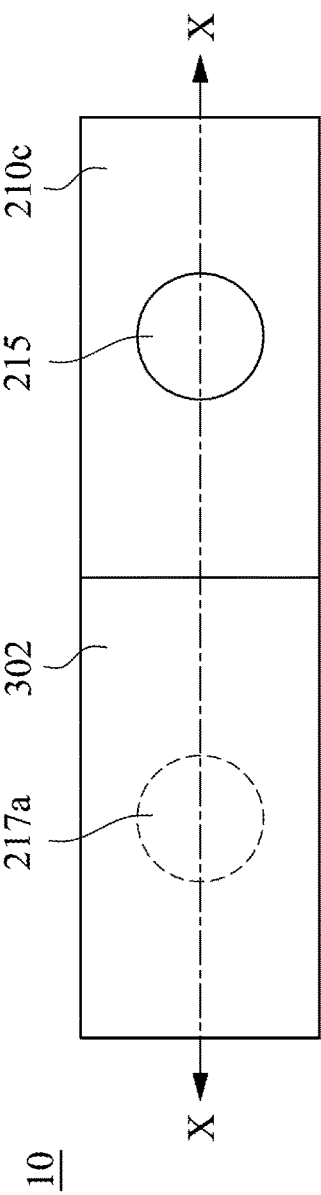
Figure 8B:
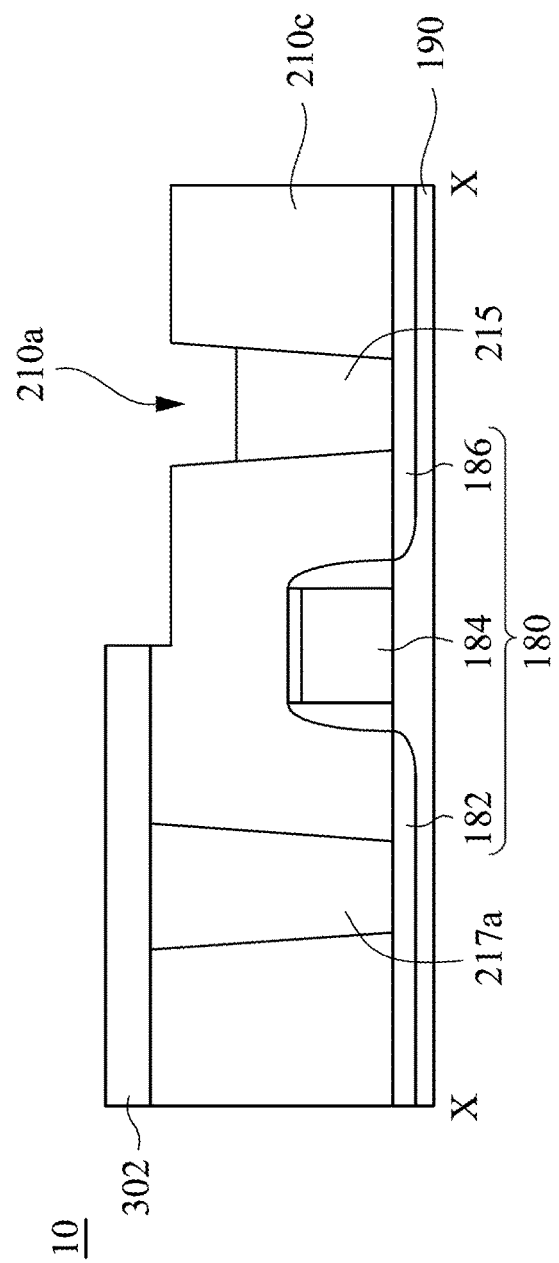

As shown in FIGS. 8A and 8B, a photoresist layer 302 is formed covering a portion of the dielectric layer 210b and the conductive contact 217a. The photoresist layer 302 is formed by using, for example, spin coating a photoresist layer material onto the dielectric layer 210b, and then transferring a pattern of a photomask (not shown) to the photoresist layer material by exposure to form the photoresist layer 302. Next, a portion of the dielectric layer 210b and a portion of the conductive contact 215a (as shown in FIG. 7B) are removed by using a dry or wet etching process to form a dielectric layer 210c having an opening 210a and a conductive contact 215. Thereby, a precursor structure 10 is formed.

Figure 9A:
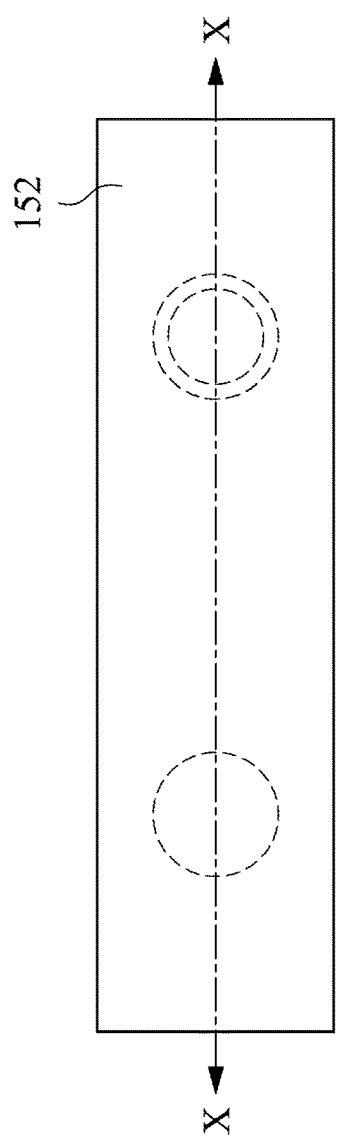
Figure 9B:
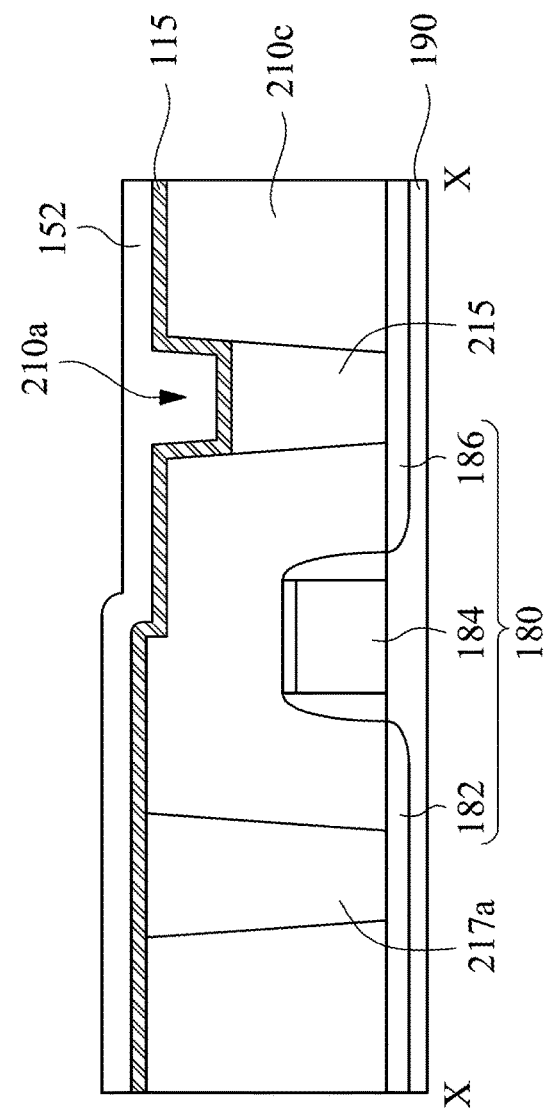

Next, as shown in FIGS. 9A and 9B, the photoresist layer 302 is removed. Next, a conductive material 115 is conformally formed over the dielectric layer 210c, the conductive contact 217a, and sidewalls and a lower surface of the opening 210a. In some embodiments, the conductive material 115, such as titanium, titanium nitride, tantalum nitride, titanium aluminum nitride, tantalum aluminum nitride, or a combination thereof, is deposited by using physical vapor deposition, chemical vapor deposition, atomic layer deposition, or the like, so that the formed conductive material 115 has good step coverage property to uniformly cover the sidewalls of the opening 210a.

Subsequently, a flat layer material 152 is formed covering the conductive material 115 and filling a remaining portion of the opening 210a. For example, titanium, titanium nitride, tantalum nitride, titanium aluminum nitride, tantalum aluminum nitride, or a combination thereof is deposited over the conductive material 115 and in the remaining portion of the opening 210a by using physical vapor deposition, chemical vapor deposition, atomic layer deposition, or the like.

Figure 10A:
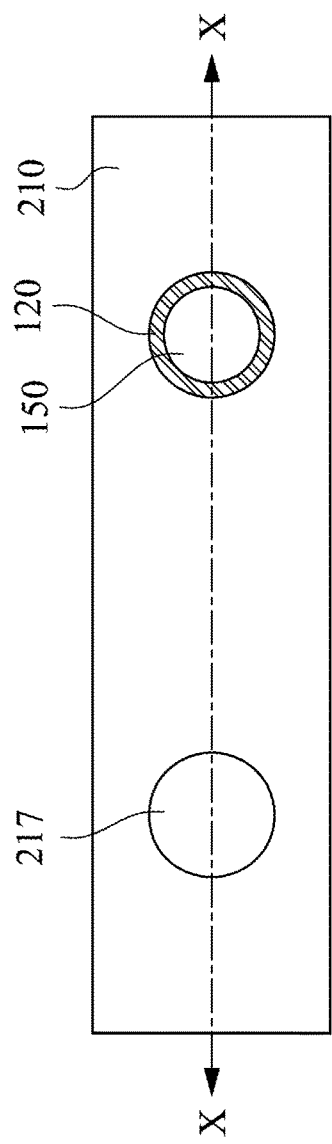
Figure 10B:
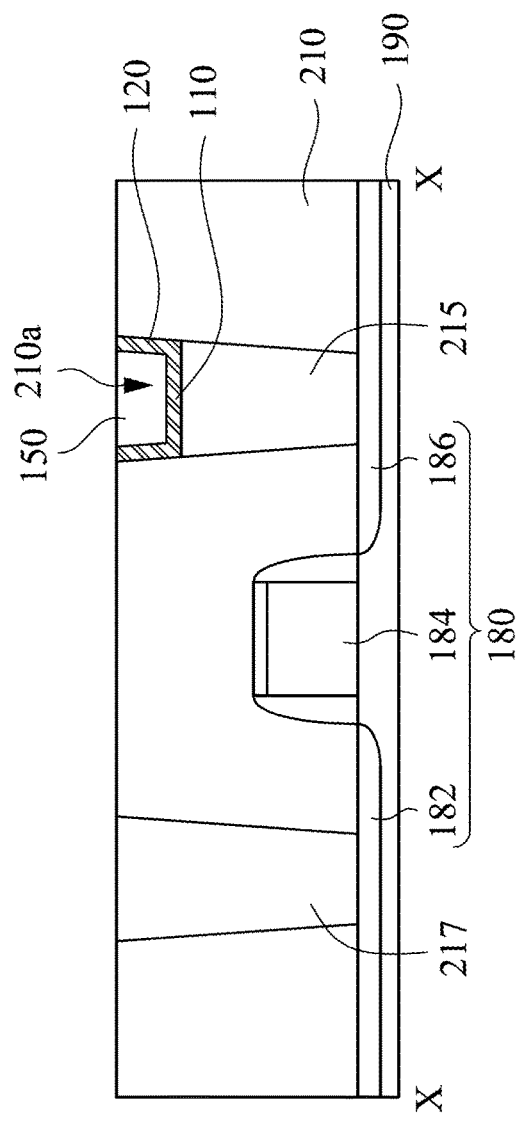

Next, as shown in FIG. 10A and FIG. 10B, the flat layer material 152, the conductive material 115, an upper portion of the conductive contact 217a, and an upper portion of the dielectric layer 210c are removed by using a chemical-mechanical polishing (CMP) process to form a lower electrode 110, an annular heater 120, an conductive contact 217, and a flat layer 150. After the chemical-mechanical polishing process, an upper surface of the formed dielectric layer 210, an upper surface of the conductive contact 217, an upper surface of the annular heater 120, and an upper surface of the flat layer 150 are coplanar.

Figure 11A:
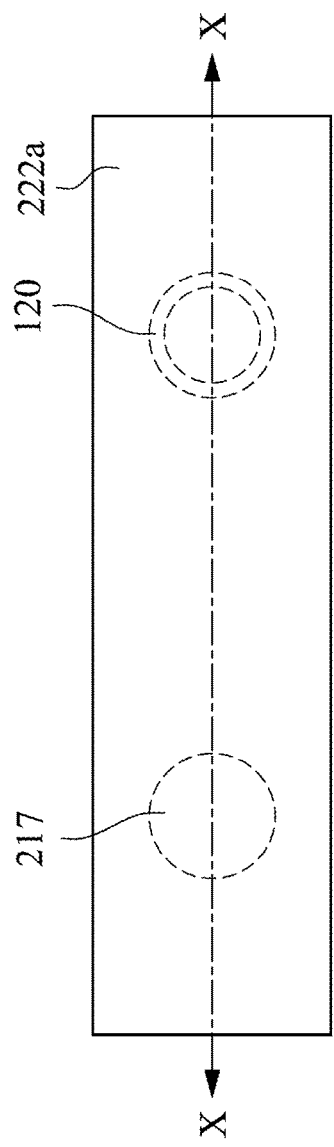
Figure 11B:
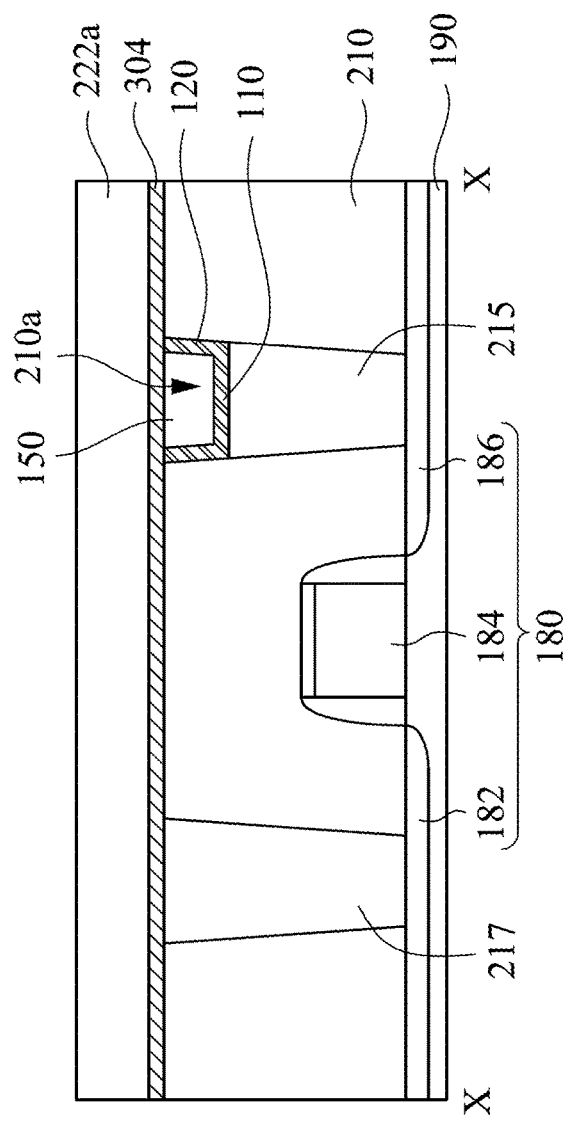

As shown in FIGS. 11A and 11B, an etch stop layer 304 is formed covering the dielectric layer 210, the annular heater 120, the conductive contact 217, and the flat layer 150. For example, nitride such as silicon nitride is deposited over the dielectric layer 210, the annular heater 120, the conductive contact 217, and the flat layer 150 by using physical vapor deposition, chemical vapor deposition, atomic layer deposition, or the like. Next, a dielectric layer 222a is formed over the etch stop layer 304. For example, an oxide such as silicon oxide is deposited covering the etch stop layer 304 by using physical vapor deposition, chemical vapor deposition, atomic layer deposition, or the like.

Figure 12A:
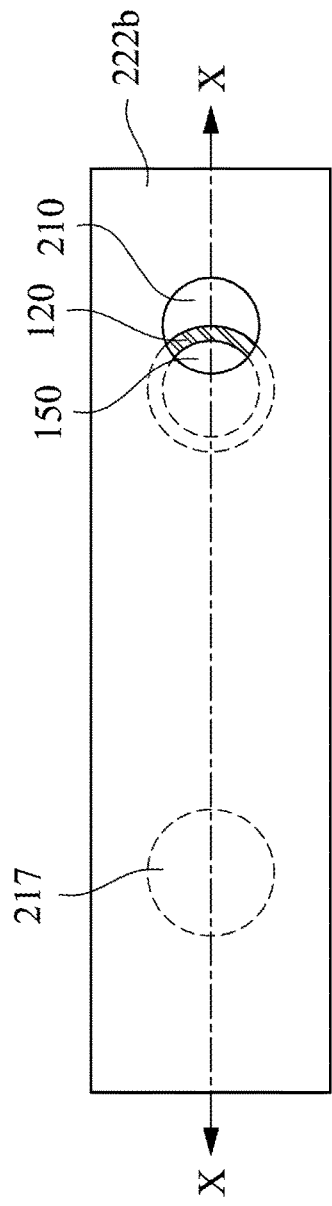
Figure 12B:
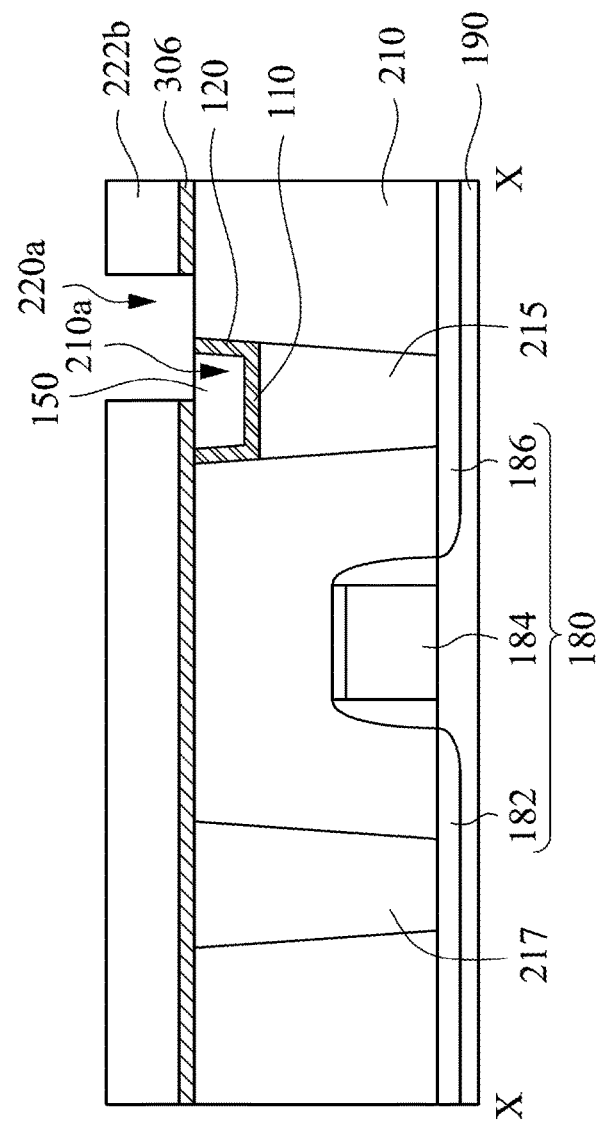

Thereafter, as shown in FIGS. 12A and 12B, a dry or wet etching process is performed to remove a portion of the dielectric layer 222a to expose a portion of the etch stop layer 304. Subsequently, another dry or wet etching process is performed to remove the exposed portion of the etch stop layer 304, thereby forming an opening 220a (as shown in FIG. 12B), in which the opening 220a exposes a portion of annular heater 120 and a portion of the flat layer 150. For example, when the dielectric layer 222a is oxide (e.g., silicon oxide) and the etch stop layer 304 is nitride (e.g., silicon nitride), an etching solution with a high etch selectivity to the dielectric layer 222a (e.g., silicon oxide) may be used during the etching process to keep the etching stop layer 304 unchanged when the portion of the dielectric layer 222a is removed to form the dielectric layer 222b. In the subsequent another etching process, an etchant having a high etch selectivity to the etch stop layer 304 (e.g., silicon nitride) is used to keep the dielectric layer 222b unchanged when the exposed portion of the etch stop layer 304 is removed.

It should be noted that in some embodiments of the present disclosure, the opening 220a formed during the etching process for removing the portion of the dielectric layer 222a and the portion of the etch stop layer 304 (as shown in FIGS. 11A and 11B) may not be precisely aligned with the annular heater 120. Specifically, the opening 220a may be misaligned with the annular heater 120 in the direction D1.

Figure 13A:
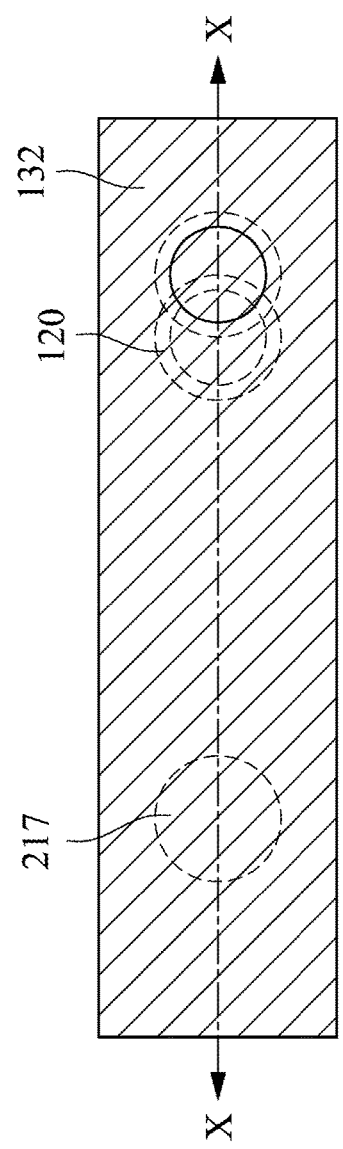
Figure 13B:
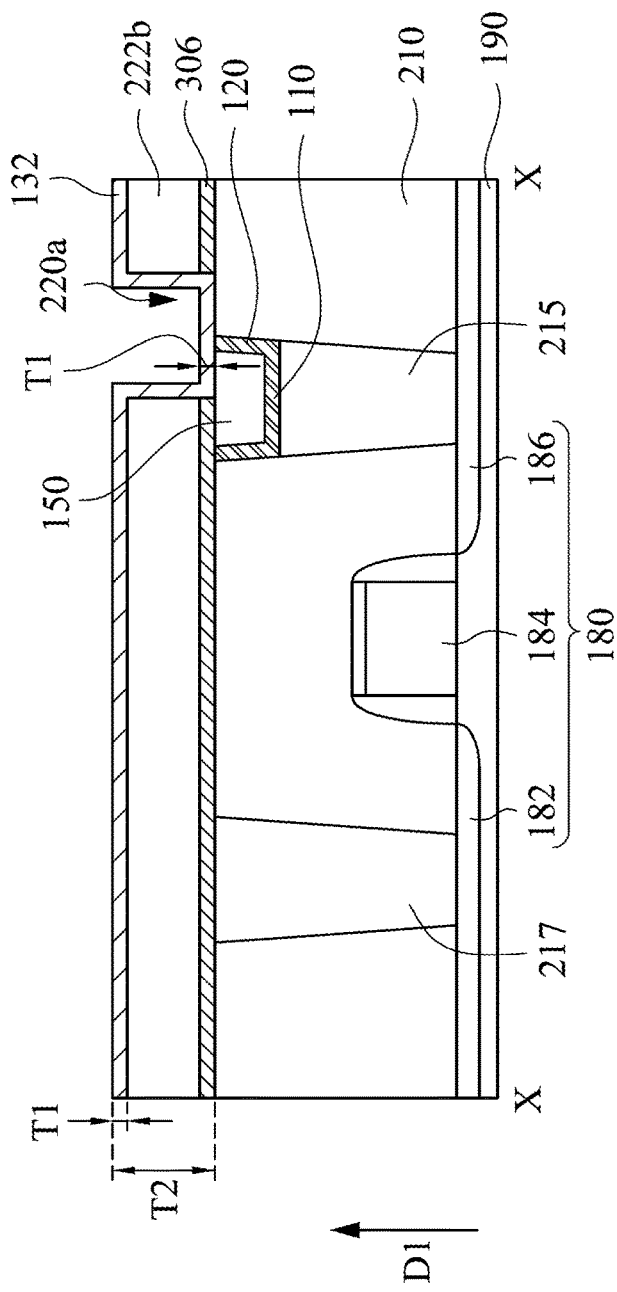

Next, as shown in FIGS. 13A and 13B, a phase change layer material 132 is conformally formed over the dielectric layer 222b, and sidewalls and a lower surface of the opening 220a. Specifically, the phase change layer material 132 has a thickness T1 over an upper surface of the dielectric layer 222b and the lower surface of the opening 220a and a thickness T2 at the sidewalls of the opening 220a, in which the thickness T2 is greater than the thickness T1. In some embodiments, the phase change layer material 132, such as germanium-antimony-tellurium, nitrogen-doped germanium-antimony-tellurium, oxygen-doped germanium-antimony-tellurium, silicon-doped germanium-antimony-tellurium, carbon-doped germanium-antimony-tellurium, antimony telluride, germanium-antimony, indium-doped antimony telluride or a combination thereof, is deposited by using physical vapor deposition, chemical vapor deposition, atomic layer deposition, etc., so that the formed phase change layer material 132 has good step coverage property to uniformly cover the sidewalls of the opening 220a.

Figure 14A:
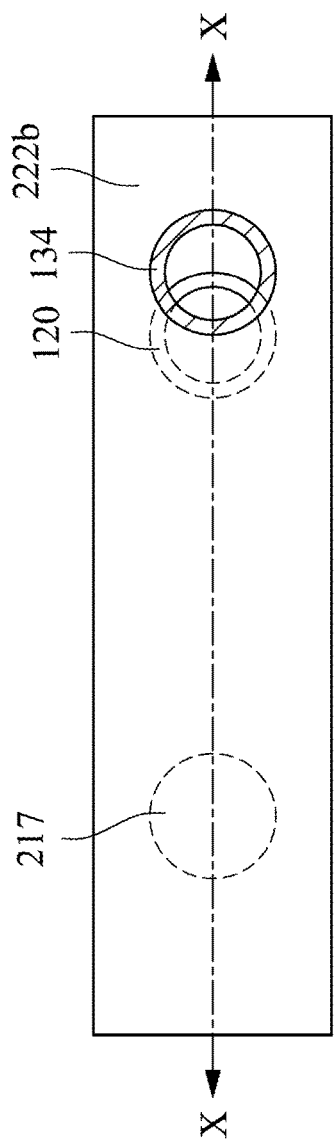
Figure 14B:
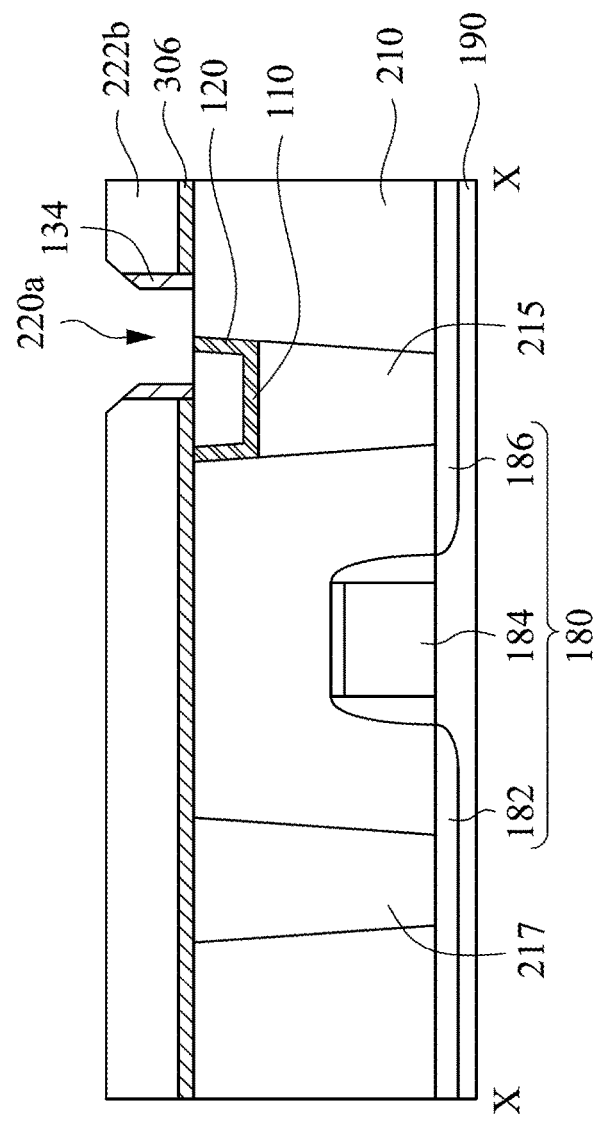

Next, as shown in FIGS. 14A and 14B, the phase change layer material 132 is removed anisotropically to form an annular phase change layer 134 over the sidewalls of the opening 220a. Specifically, in this operation, a dry etching process may be used to reduce the thickness of the phase change layer material 132 (shown in FIGS. 13A and 13B) in an anisotropic manner, and the phase change layer material 132 located over the upper surface of the dielectric layer 222b and the lower surface of the opening 220a are removed. However, since the thickness T2 of the phase change layer material 132 on the sidewalls of the opening 220a is larger, and therefore the phase change layer material 132 is not completely removed after the etching process and forms the annular phase change layer 134 on the sidewalls of the opening 220a.

Figure 15A:
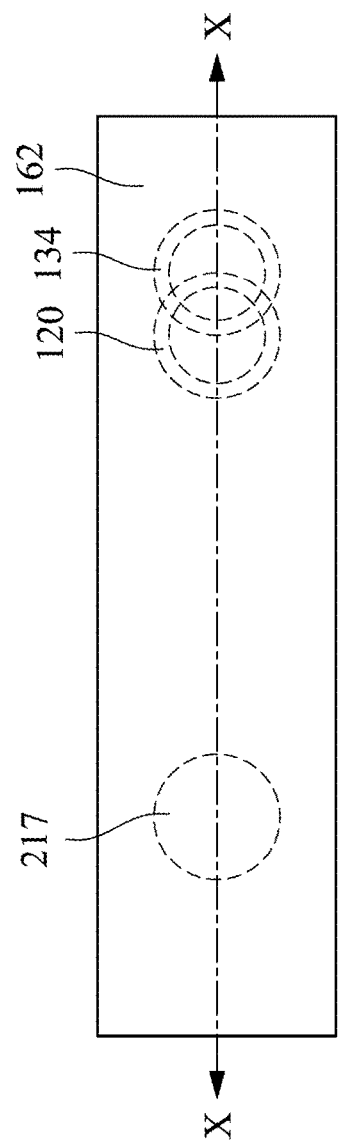
Figure 15B:
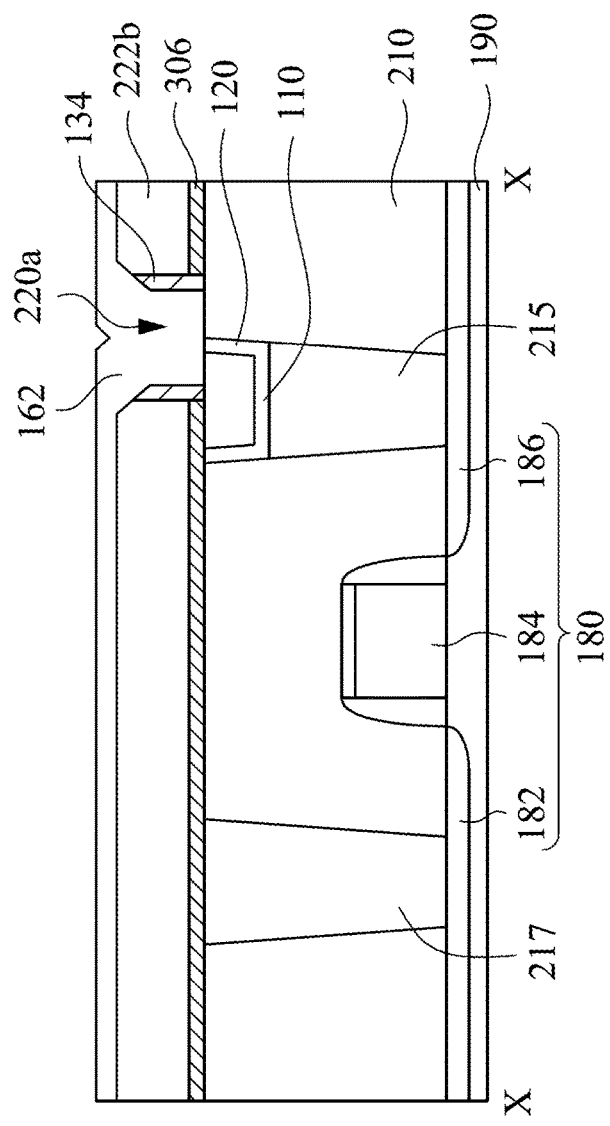

Please refer to FIG. 15A and FIG. 15B, a filling material 162 is formed covering the dielectric layer 222b and filling the remaining portion of the opening 220a. For example, a material, such as silicon oxide, silicon nitride, silicon oxynitride, or metal oxide alloy, metal nitride alloy or other alloy having a higher electrical resistance than the phase change material, is deposited over the dielectric layer 222b and in the remaining portion of opening 220a by using physical vapor deposition, chemical vapor deposition, atomic layer deposition, etc. The above metal oxide alloy, metal nitride alloy or other alloy having a higher electrical resistance than the phase change material has better adhesion property to the annular phase change layer 134, and thus the phase change element has better reliability when the phase change element repeatedly undergoes high and low temperature cycle operations.

Figure 16A:
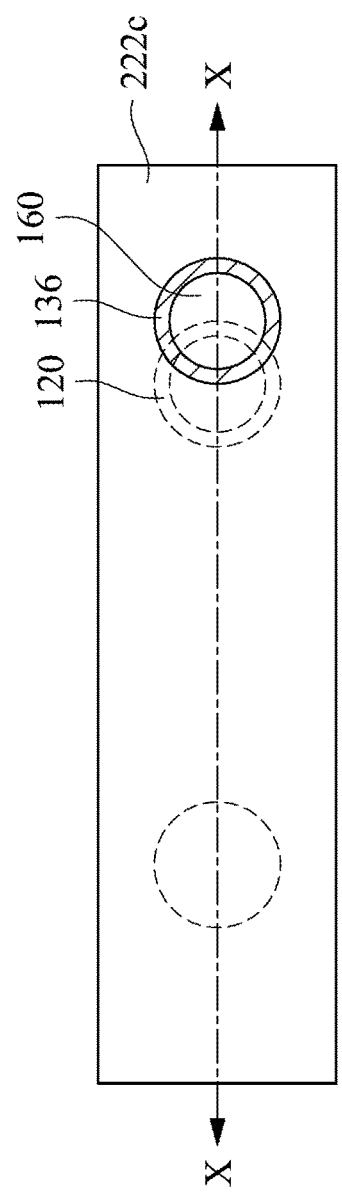
Figure 16B:
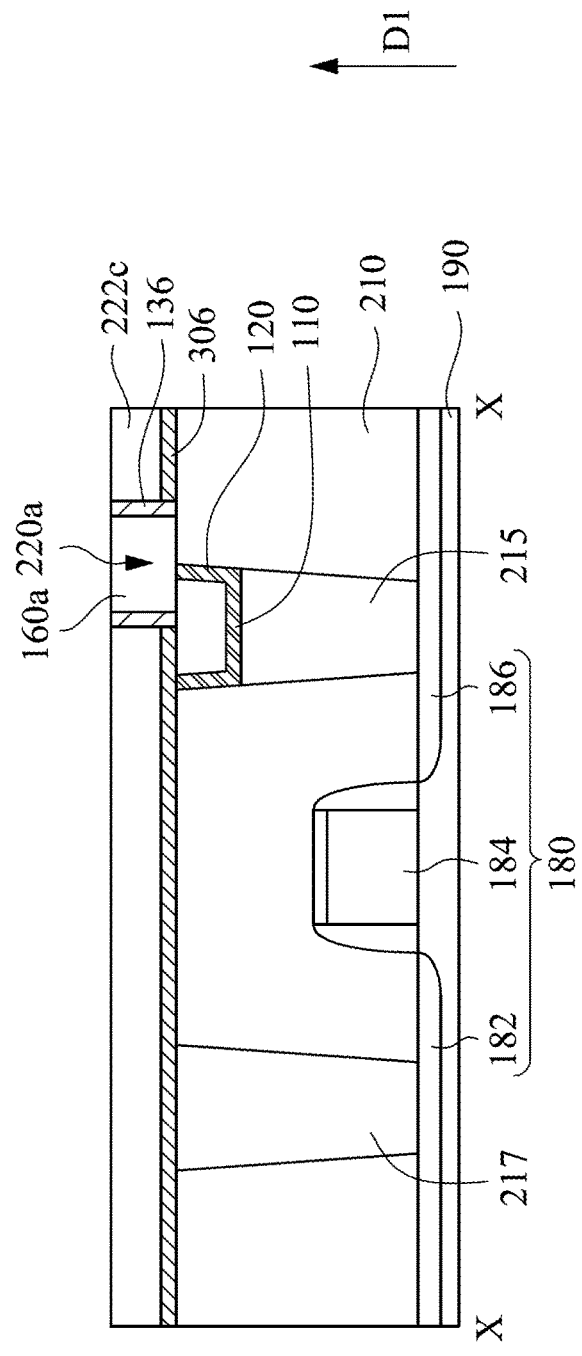

Next, as shown in FIGS. 16A and 16B, upper portions of the filling material 162, the annular phase change layer 134, and the dielectric layer 222b are removed by using a chemical-mechanical polishing process to form an annular phase change layer 136, a filling layer 160a, and a dielectric layer 222c. After the chemical-mechanical polishing process, an upper surface of the annular phase change layer 136, an upper surface of the filling layer 160a, and an upper surface of the dielectric layer 222c are coplanar.

Next, as shown in FIGS. 17A and 17B, a dry or wet etching process is performed to remove a portion of the dielectric layer 222c to form an opening 222d exposing a portion of the etch stop layer 306. The opening 222d is aligned with the conductive contact 217. For example, when the dielectric layer 222c is oxide (e.g., silicon oxide) and the etch stop layer 306 is nitride (e.g., silicon nitride), an etchant having a high selectivity to the dielectric layer 222c (e.g., silicon oxide) is used during the etching process to keep the etch stop layer 306 unchanged when the portion of the dielectric layer 222c is removed to form the dielectric layer 222.

Figure 18A:
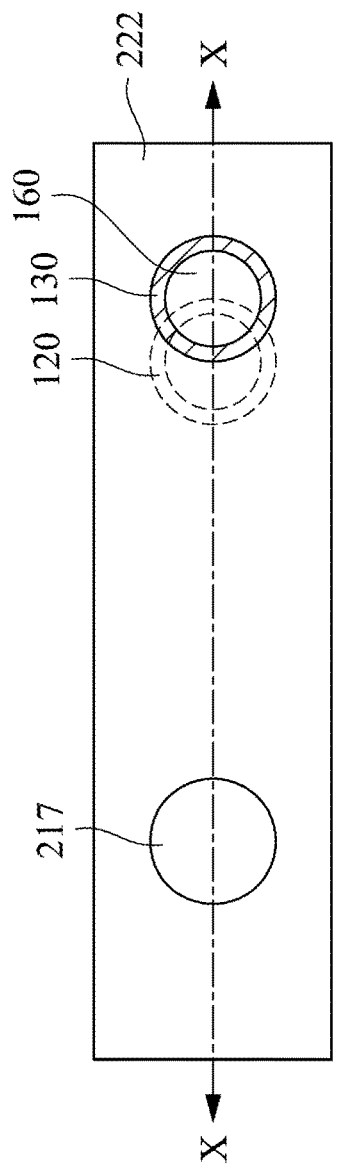
Figure 18B:
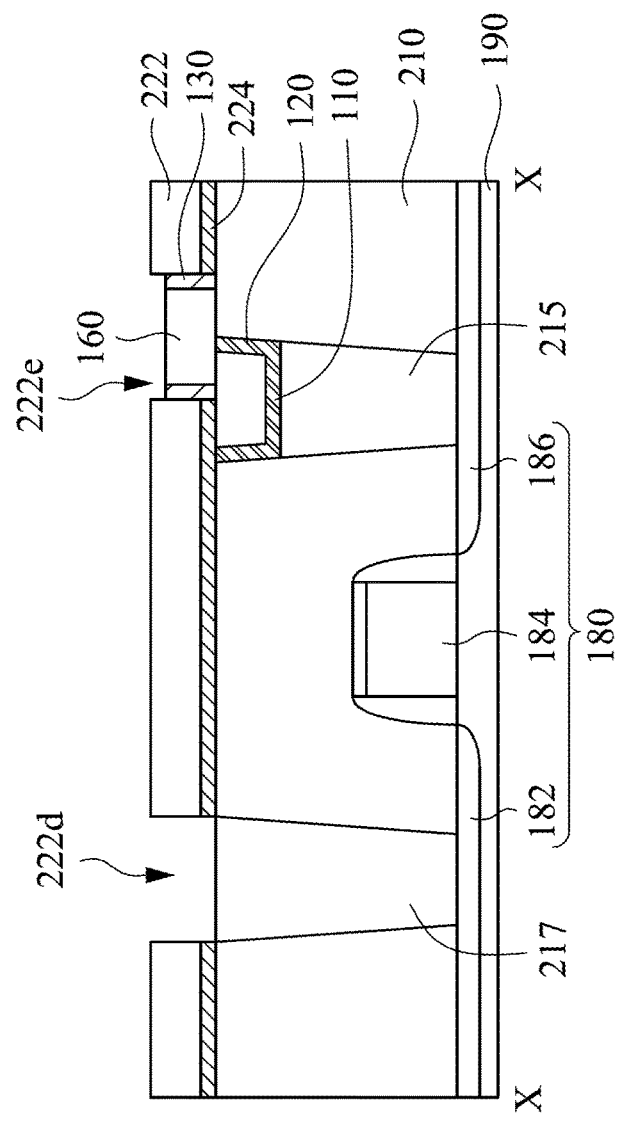

Subsequently, as shown in FIGS. 18A and 18B, a dry or wet etching process is performed to remove an exposed portion of the etch stop layer 306, and upper portions of the annular phase change layer 136 and the filling layer 160a, so that the opening 222d exposes the conductive contact 217, and an annular phase change layer 130 and a filling layer 160 are formed. Specifically, the upper portions of the annular phase change layer 136 and the filling layer 160a are removed to form a recess 222e. For example, an etchant having a high etch selectivity of the etch stop layer 306 with respect to the annular phase change layer 136 and the filling layer 160a is used, so that the dielectric layer 222 remains the same or only a small portion of the dielectric layer 222 is removed during the removal of the etch stop layer 306, the annular phase change layer 136 and the filling layer 160a.

Figure 19A:
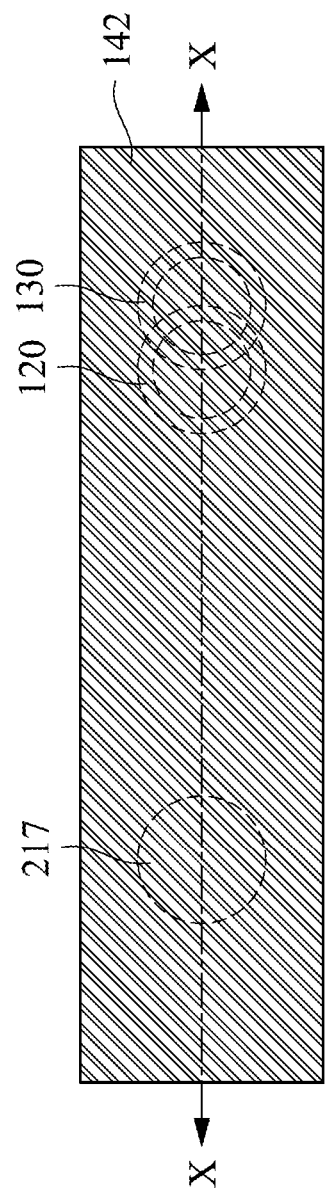
Figure 19B:
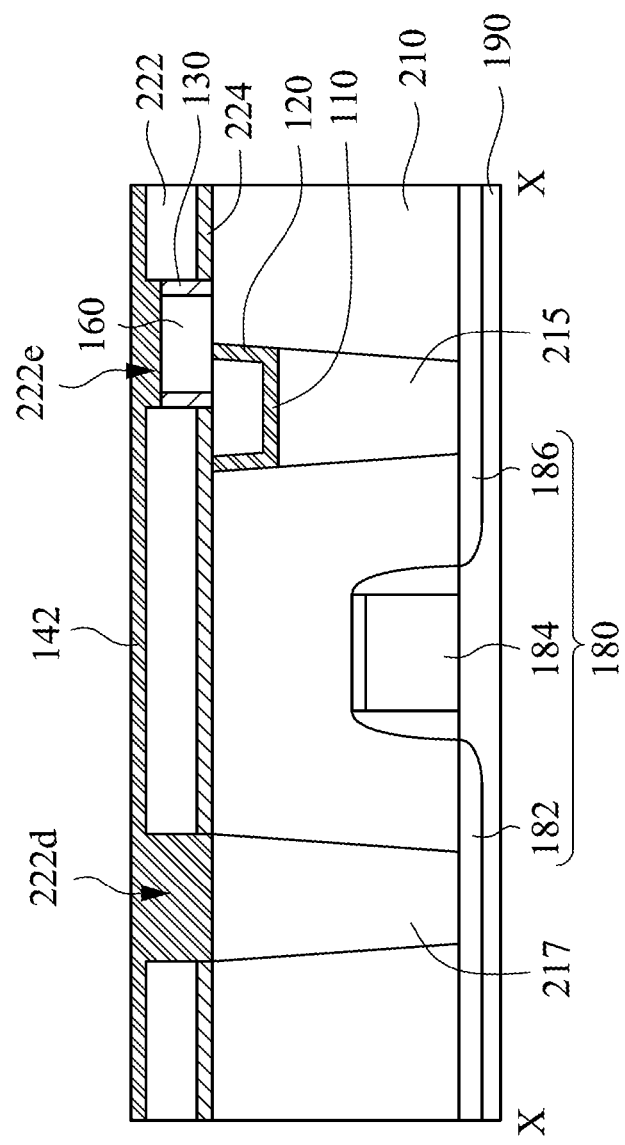

Please refer to FIG. 19A and FIG. 19B, a conductive material 142 is formed covering the dielectric layer 222 and filling the opening 222d and the recess 222e. For example, a material, such as titanium, titanium nitride, tantalum nitride, titanium aluminum nitride, tantalum aluminum nitride, or a combination thereof, is deposited over the dielectric layer 222 and in the opening 222d and the recess 222e by using physical vapor deposition, chemical vapor deposition, atomic layer deposition, or the like.

Figure 20A:
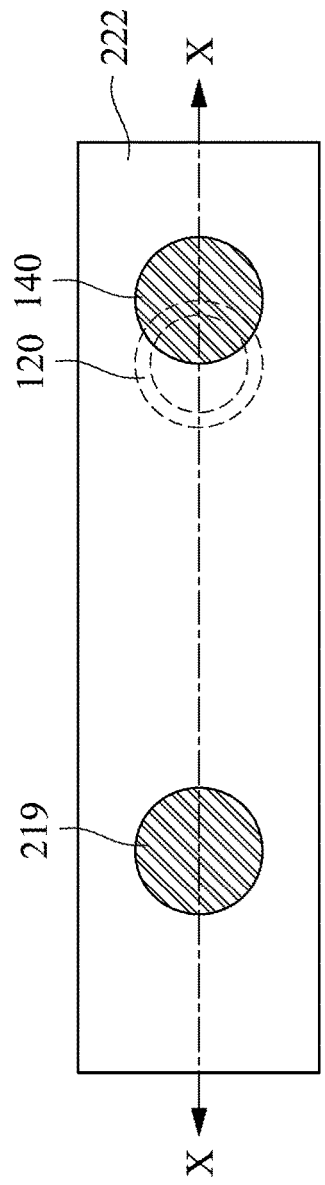
Figure 20B:
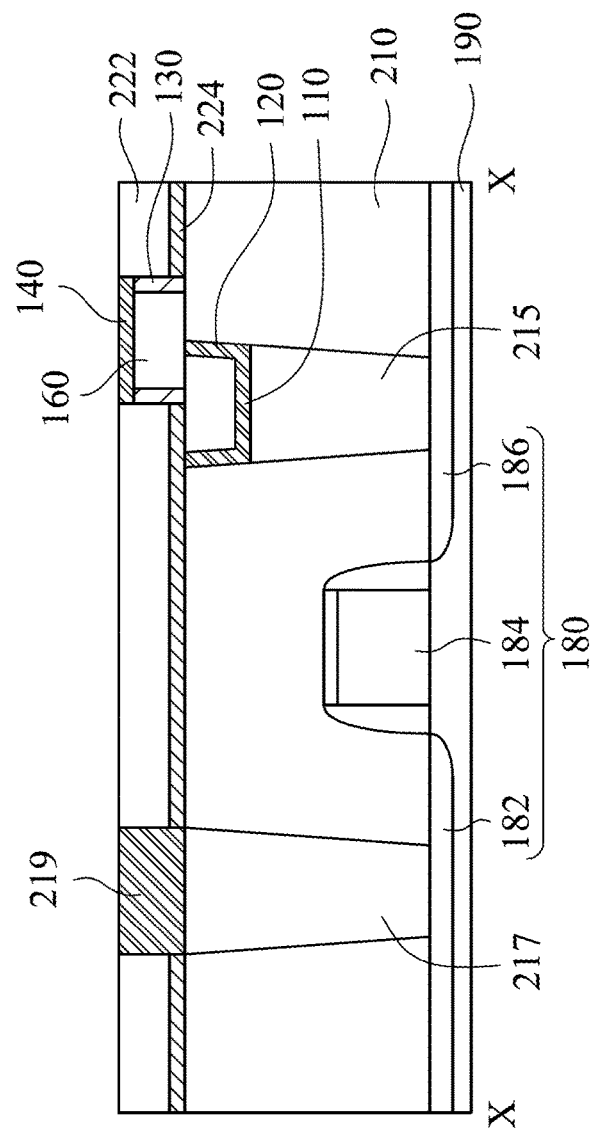

Next, as shown in FIGS. 20A and 20B, a chemical-mechanical polishing process is performed to remove an upper portion of the conductive material 142 to form a conductive contact 219 and an upper electrode 140. After the chemical-mechanical polishing process, an upper surface of the formed conductive contact 219, an upper surface of the upper electrode 140, and an upper surface of the dielectric layer 222 are coplanar.

Figure 21A:
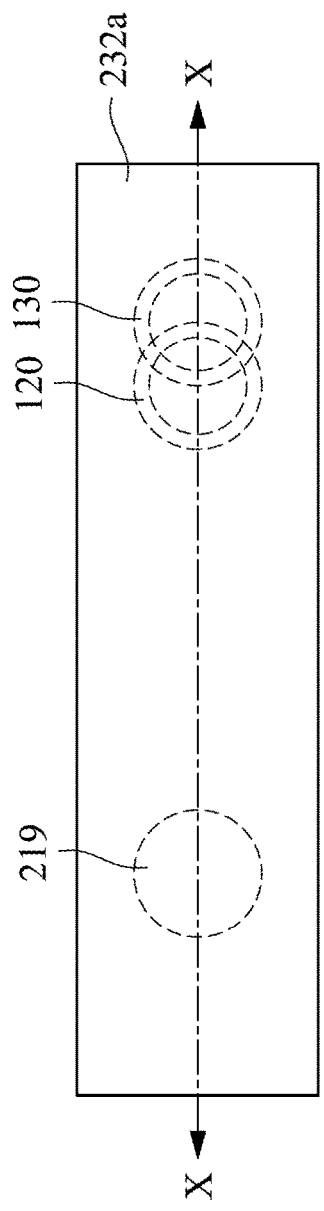
Figure 21B:
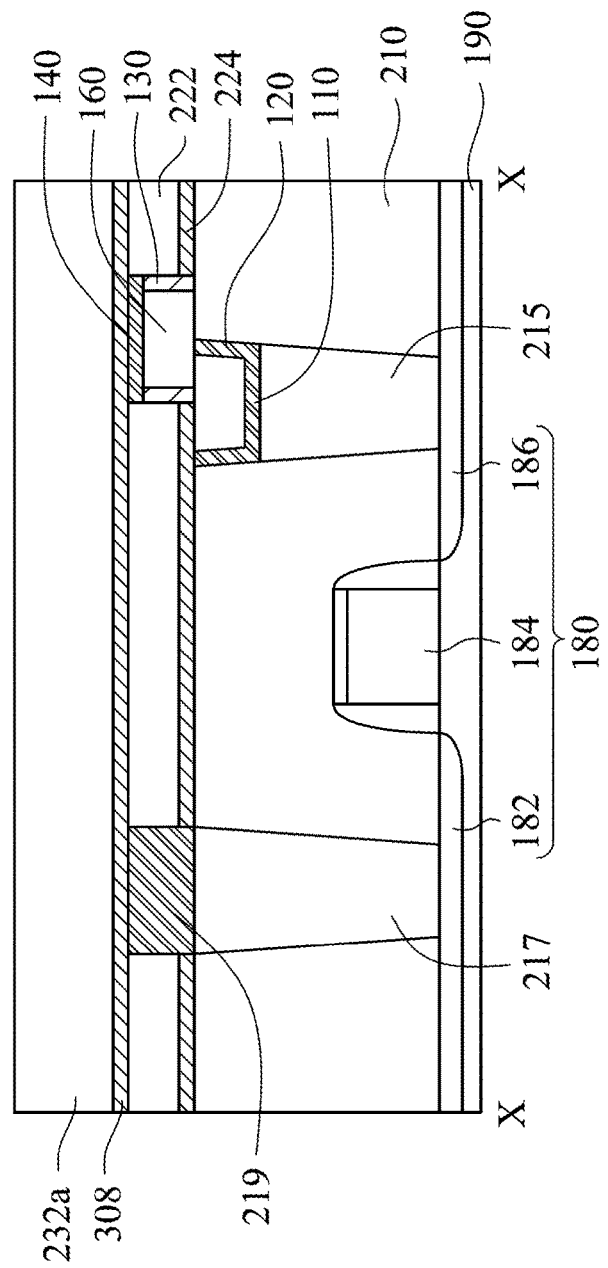

As shown in FIGS. 21A and 21B, an etch stop layer 308 is formed covering the dielectric layer 222, the conductive contact 219, and the upper electrode 140. For example, a material, such as nitrogen-doped silicon carbide (SiCN), is deposited over the dielectric layer 222, the conductive contact 219, and the upper electrode 140 by using physical vapor deposition, chemical vapor deposition, atomic layer deposition, or the like. Next, a dielectric layer 232a is formed over the etch stop layer 308. For example, oxide, such as silicon oxide, is deposited covering the etch stop layer 308 by using physical vapor deposition, chemical vapor deposition, atomic layer deposition, or the like.

Figure 22A:
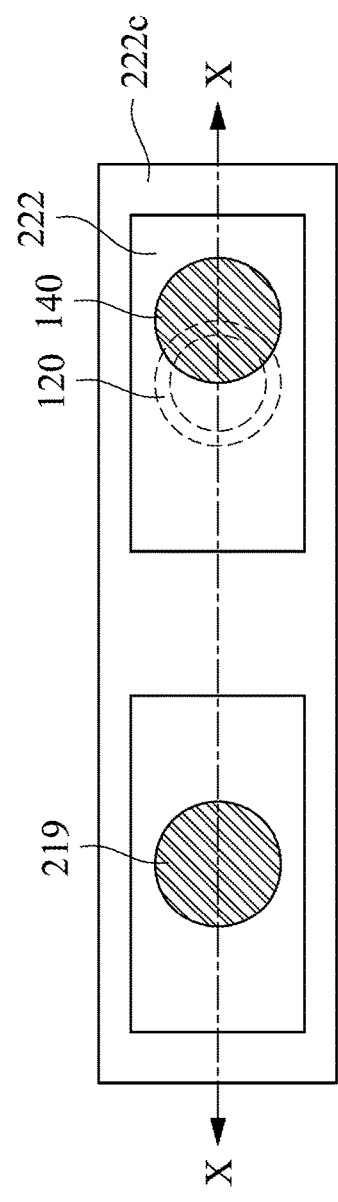
Figure 22B:
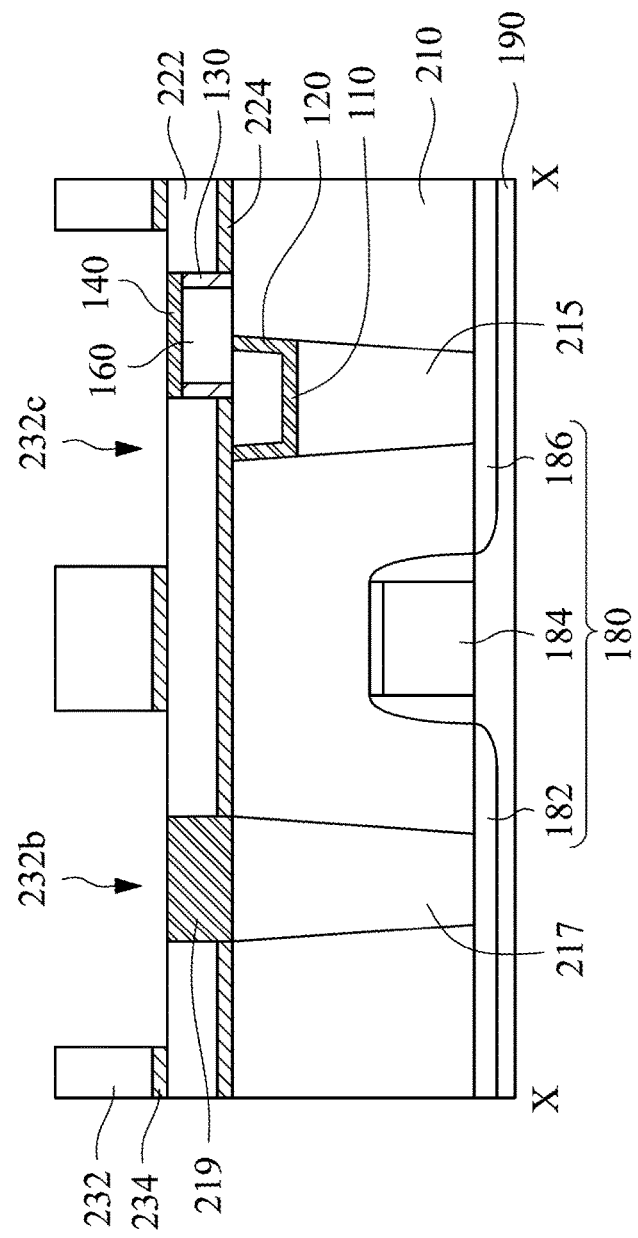

Thereafter, as shown in FIGS. 22A and 22B, a dry or wet etching process is performed to remove a portion of the dielectric layer 232a to expose a portion of the etch stop layer 308. Subsequently, another dry or wet etching process is performed to remove the exposed portion of the etch stop layer 308, thereby forming openings 232b, 232c, in which the openings 232b, 232c expose the conductive contact 219 and upper electrodes 140, respectively. For example, when the dielectric layer 232a is oxide (e.g., silicon oxide) and the etch stop layer 308 is nitrogen-doped carbide (e.g., SiCN), an etchant having a high selectivity to the dielectric layer 232a (e.g., silicon oxide) may be used during the etching process to keep the etch stop layer 308 unchanged when the portion of the dielectric layer 232a is removed to form the dielectric layer 232. In the subsequent another etching process, an etchant having a high etch selectivity to the etch stop layer 308 (e.g., SiCN) is used to keep the dielectric layer 232 unchanged when the exposed portion of the etch stop layer 308 is removed.

Figure 23A:
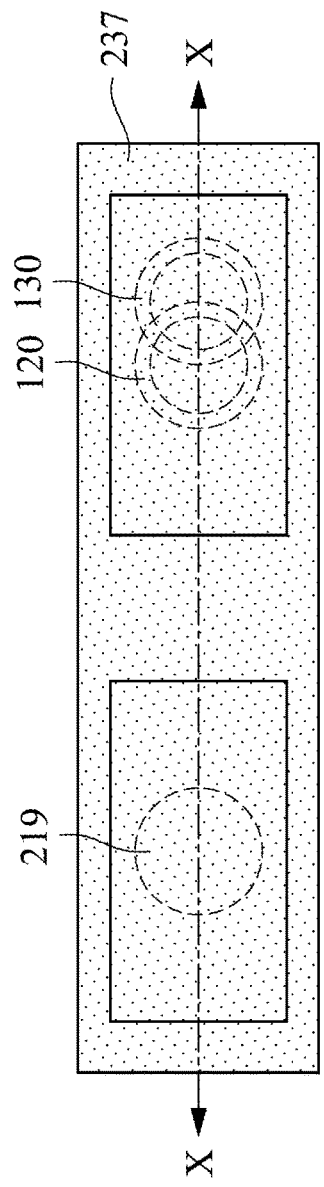
Figure 23B:
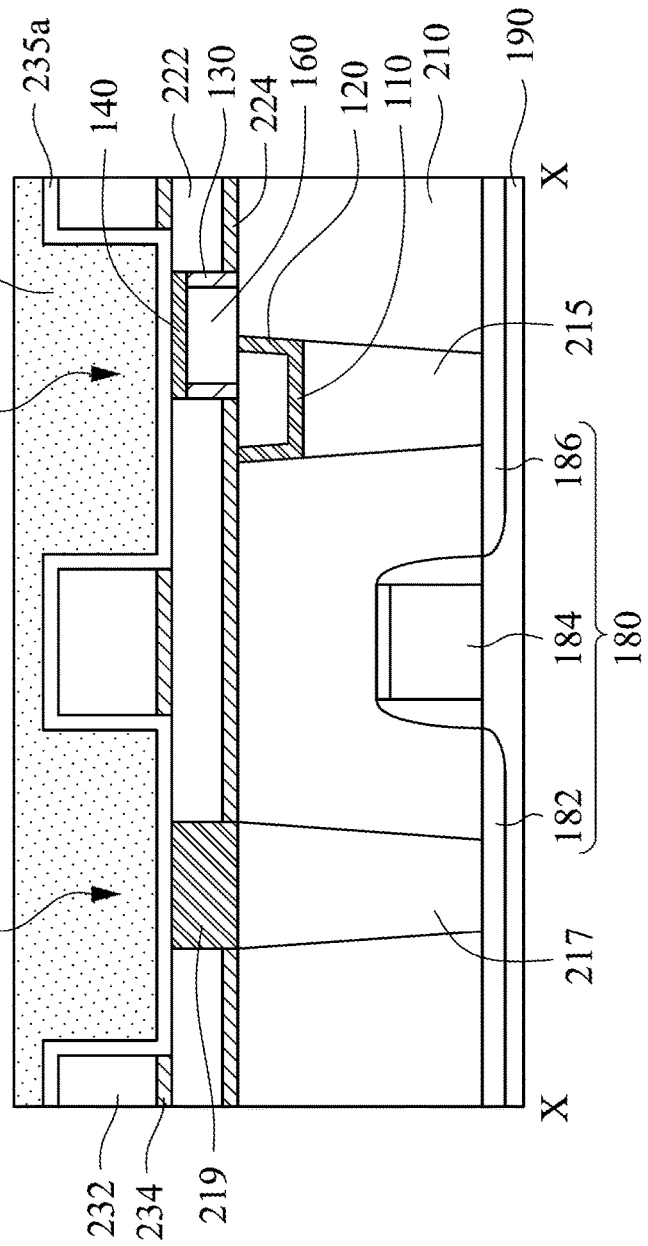

Next, as shown in FIGS. 23A and 23B, a barrier layer material 235a is conformally formed over the dielectric layer 232, and sidewalls and lower surfaces of the openings 232b, 232c. In some embodiments, a barrier layer material 235a, such as titanium, tantalum, titanium nitride, tantalum nitride, tantalum carbide, tantalum silicon nitride or a combination thereof, is deposited by using physical vapor deposition, chemical vapor deposition, atomic layer deposition, or the like, so that the formed barrier layer material 235a has good step coverage property to uniformly cover the sidewalls of the openings 232b, 232c.

Next, a conductive material 237 is formed covering the barrier layer material 235a and filling remaining portions of the openings 232b, 232c. For example, a material, such as metal, metal compound, or a combination thereof, is deposited over the barrier layer material 235a and in the remaining portions of the openings 232b, 232c by using physical vapor deposition, chemical vapor deposition, atomic layer deposition, electroplating, or the like.

Next, the barrier layer material 235a and the conductive material 237 over the dielectric layer 232 are removed by using a chemical-mechanical polishing process to form a barrier layer 235 and metal connection lines 231, 233 of the phase change memory 100a as shown in FIGS. 1A-1C. After the chemical-mechanical polishing process is performed, an upper surface of the formed barrier layer 235, upper surfaces of the metal connection lines 231, 233, and an upper surface of the dielectric layer 232 are coplanar.

The present disclosure also provides a method of fabricating a phase change memory 100b (shown in FIGS. 3A-3C). FIGS. 24A-26A are top views of various stages of a method of fabricating the phase change memory 110b according to other embodiments of the present disclosure. FIGS. 24B-26B are cross-sectional views of intermediate structures taken along line X-X of FIGS. 24A-26A, respectively.

Figure 24A:
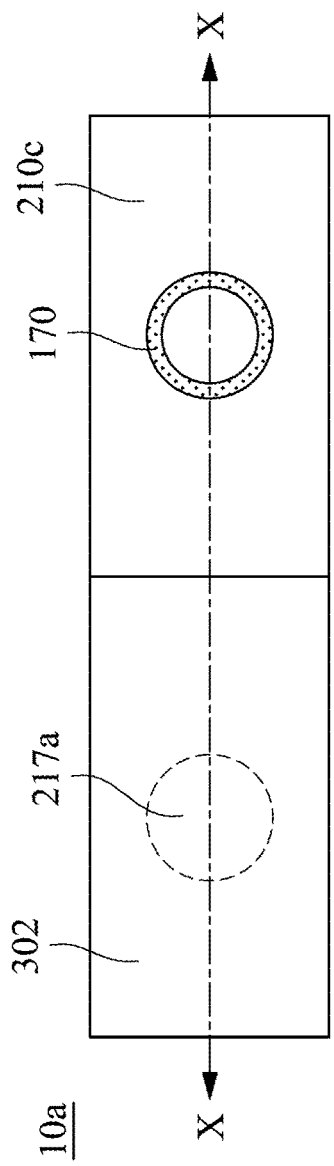
Figure 24B:
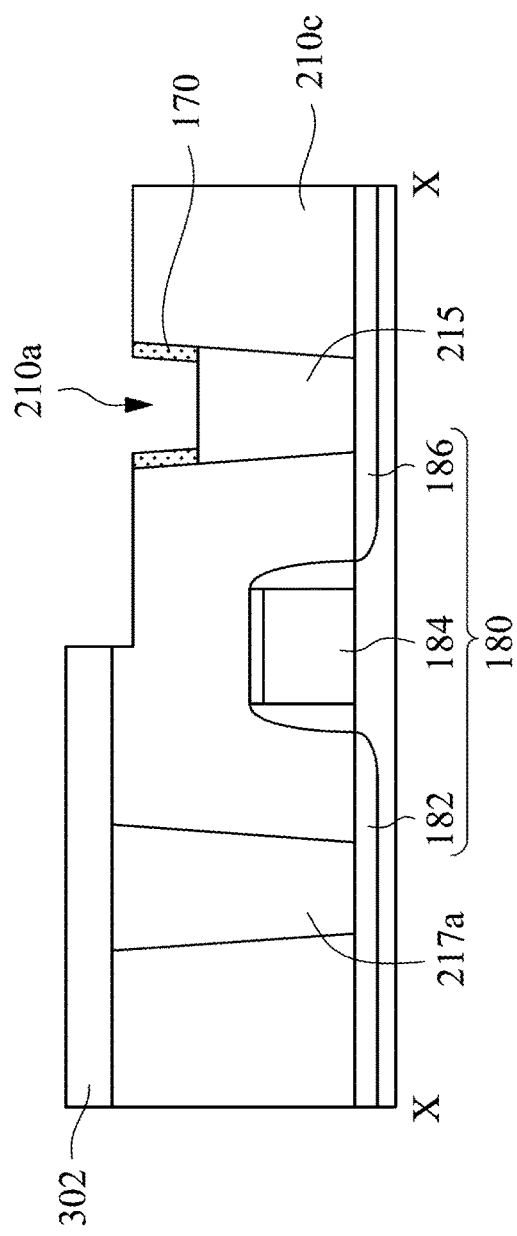

FIGS. 24A and 24B following FIGS. 8A and 8B, an annular spacer 170 is formed over a sidewall of the opening 210a. For example, a dielectric material, such as silicon oxide, silicon nitride or silicon oxynitride, is deposited over the dielectric layer 210c and sidewalls and a lower surface of the opening 210a by using physical vapor deposition, chemical vapor deposition, atomic layer deposition, or the like. Next, the dielectric material over the dielectric layer 210c and the dielectric material over the lower surface of the opening 210a are anisotropically removed to form the annular spacer 170 over the sidewalls of the opening 210a.

Next, as shown in FIGS. 25A and 25B, the photoresist layer 302 is removed. Next, a conductive material 115 is conformally formed over the dielectric layer 210c, the conductive contact 217a, and sidewalls and a lower surface of the hollow portion (i.e., the remaining portion of the opening 210a) of the annular spacer 170. In some embodiments, a conductive material 115, such as titanium, titanium nitride, tantalum nitride, titanium aluminum nitride, tantalum aluminum nitride, or a combination thereof, is deposited by using physical vapor deposition, chemical vapor deposition, atomic layer deposition, or the like, so that the formed conductive material 115 has good step coverage property to uniformly cover the inner sidewalls of the annular spacer 170.

Subsequently, a flat layer material 152 is formed covering the conductive material 115 and filling a remaining portion of the opening 210a. For example, titanium, titanium nitride, tantalum nitride, titanium aluminum nitride, tantalum aluminum nitride, or a combination thereof is deposited over the conductive material 115 and in the remaining portion of the opening 210a by using physical vapor deposition, chemical vapor deposition, atomic layer deposition, or the like.

Figure 26A:
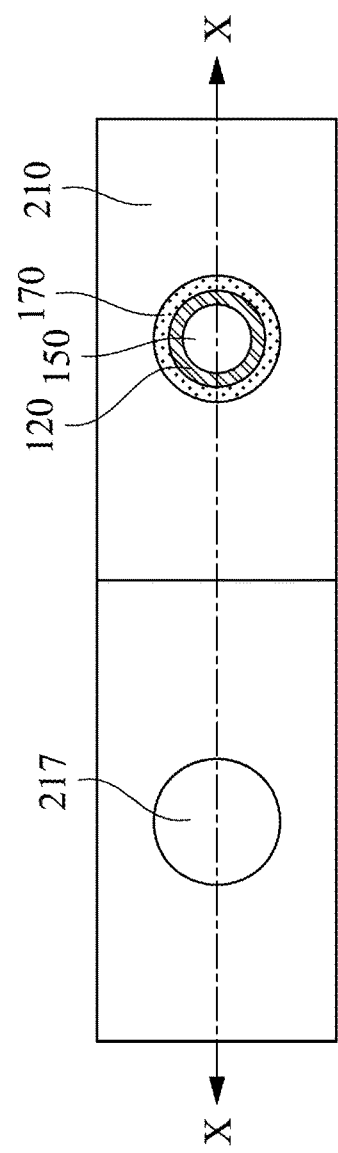
Figure 26B:
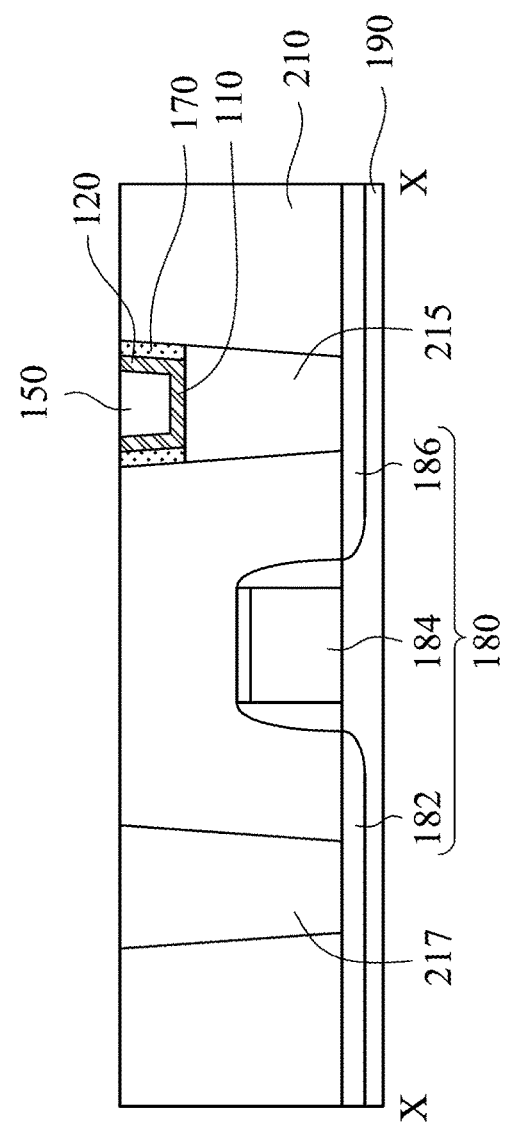

Next, as shown in FIGS. 26A and 26B, the flat layer material 152, the conductive material 115, the conductive contact 217a, and an upper portion of the dielectric layer 210c are removed by using a chemical-mechanical polishing process to form a lower electrode 110, an annular heater 120, a conductive contact 217, and a flat layer 150. After the chemical-mechanical polishing process, an upper surface of the formed dielectric layer 210, an upper surface of the conductive contact 217, an upper surface of the annular heater 120, an upper surface of the annular spacer 170, and an upper surface of the flat layer 150 are coplanar.

It should be noted that methods of forming the conductive contact 219, the dielectric layer 220 (including the upper dielectric layer 222 and the lower dielectric layer 224), the dielectric layer 230 (including the upper dielectric layer 232 and the lower dielectric layer 234), the annular phase change layer 130, the upper electrode 140, the filling layer 160, the barrier layer 235, and the metal connection lines 231, 233 of the phase change memory 100b as shown in FIGS. 3A-3C are similar to the processes of forming the same elements of the phase change memory 100a as described above, and thus reference may be made to the description of FIGS. 11A-23B and related paragraphs, and those are not repeated herein.

The present disclosure also provides a method of fabricating a phase change memory 100c (shown in FIGS. 5A-5C). FIGS. 27A-28A are top views of various stages of a method of fabricating the phase change memory 100c according to other embodiments of the present disclosure. FIGS. 27B-28B are cross-sectional views showing intermediate structures taken along line X-X of FIGS. 27A-28A, respectively.

Figure 27A:
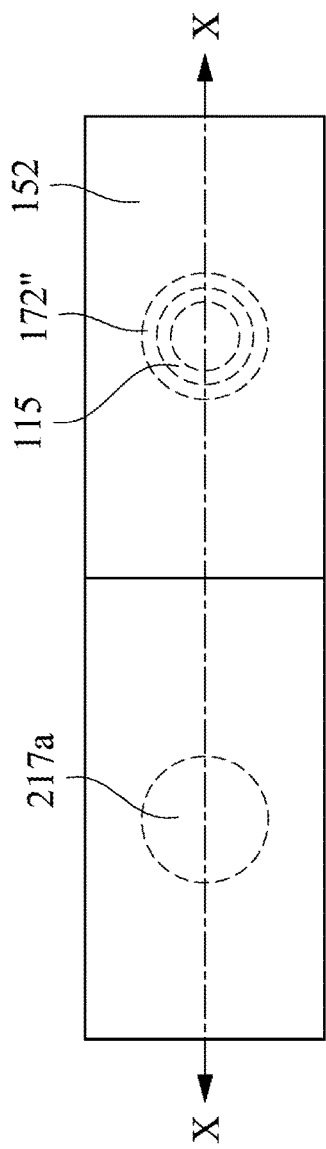
Figure 27B:
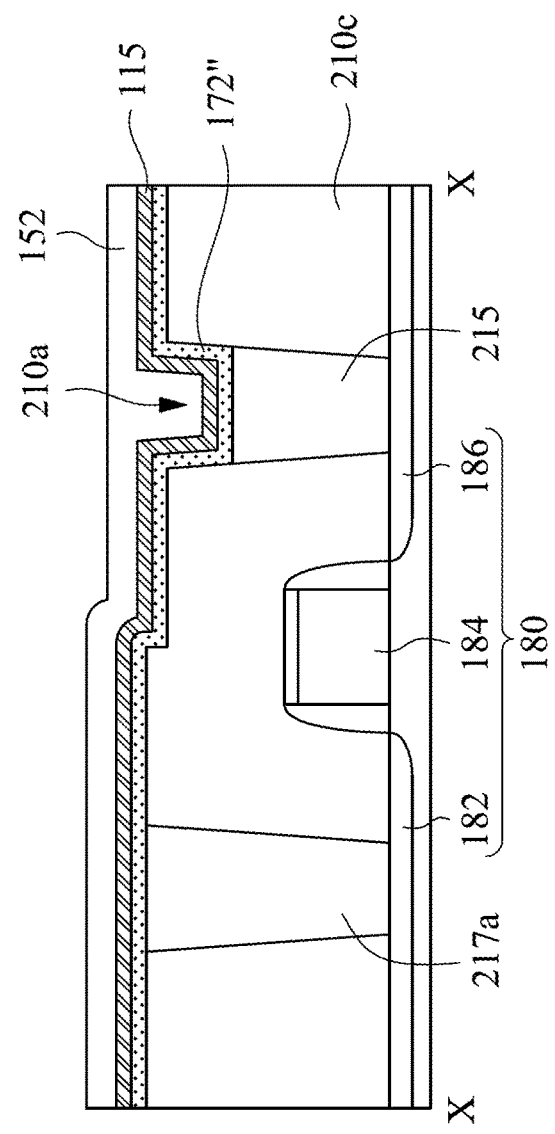

FIGS. 27A and 27B continue FIGS. 8A and 8B, and the photoresist layer 302 is removed. Next, a barrier layer material 172" is conformally formed over the dielectric layer 210c, the conductive contact 217a, and sidewalls and a lower surface of the opening 210a. For example, a barrier layer material 172", such as tantalum nitride, is deposited over the dielectric layer 210c, the conductive contact 217a, and the sidewalls and the lower surface of the opening 210a by using physical vapor deposition, chemical vapor deposition, atomic layer deposition, or the like.

Next, a conductive material 115 is conformally formed over the barrier layer material 172". In some embodiments, a conductive material 115, such as titanium, titanium nitride, or the like, is deposited over the barrier layer material 172" by using physical vapor deposition, chemical vapor deposition, atomic layer deposition, or the like.

Subsequently, a flat layer material 152 is formed covering the conductive material 115 and filling the remaining portion of the opening 210a. For example, titanium, titanium nitride, tantalum nitride, titanium aluminum nitride, tantalum aluminum nitride, or a combination thereof is deposited over the conductive material 115 and in the remaining portion of the opening 210a by using physical vapor deposition, chemical vapor deposition, atomic layer deposition, or the like.

Figure 28A:
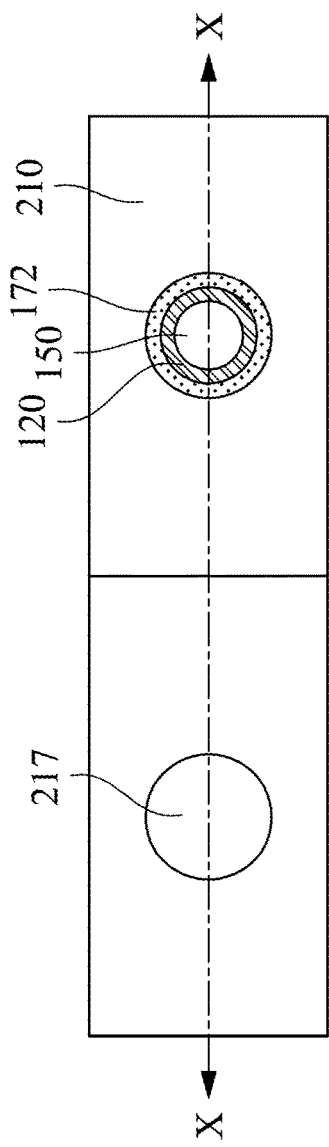
Figure 28B:
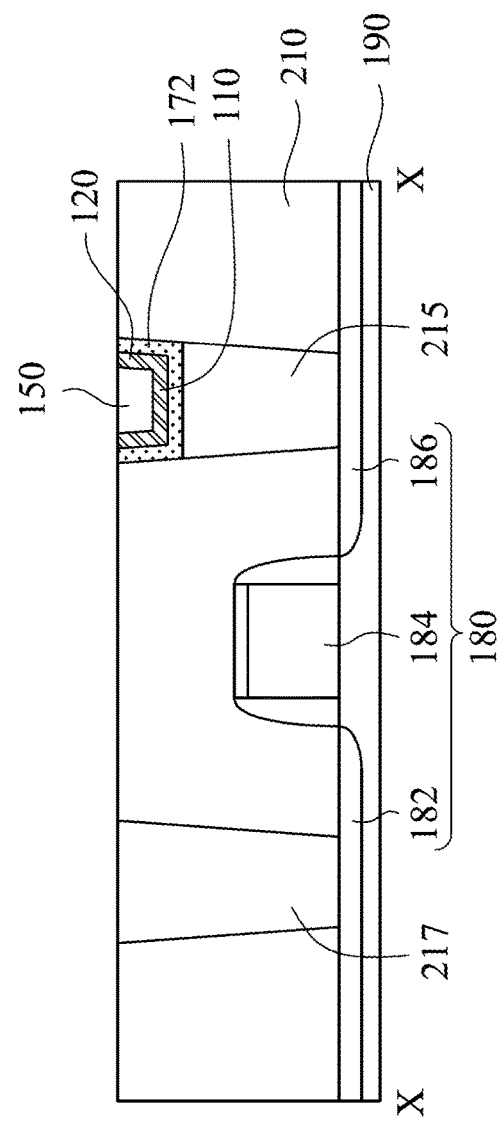

Next, as shown in FIGS. 28A and 28B, the flat layer material 152, the conductive material 115, the barrier layer material 172", the conductive contact 217a, and an upper portion of the dielectric layer 210c are removed by using a chemical-mechanical polishing process to form a lower electrode 110, an annular heater 120, a barrier layer 172, a conductive contact 217, and a flat layer 150. After the chemical-mechanical polishing process, an upper surface of the formed dielectric layer 210, an upper surface of the conductive contact 217, an upper surface of the annular heater 120, an upper surface of the barrier layer 172, and an upper surface of the flat layer 150 are coplanar.

It should be noted that methods of forming the conductive contact 219, the dielectric layer 220 (including the upper dielectric layer 222 and the lower dielectric layer 224), the dielectric layer 230 (including the upper dielectric layer 232 and the lower dielectric layer 234), the annular phase change layer 130, the upper electrode 140, the filling layer 160, the barrier layer 235, and the metal connection lines 231, 233 of the phase change memory 100c as shown in FIGS. 5A-5C are similar to the processes of forming the same elements of the phase change memory 100a as described above, and thus reference may be made to the description of FIGS. 11A-23B and related paragraphs, and those are not repeated herein.

According to the above embodiments of the present disclosure, compared to the prior art, in the manufacturing process of the phase change memory of the present disclosure, the annular heater and the annular phase change layer do not need to be precisely aligned, and just make the two misalign to significantly reduce the contact area therebetween. That is, the present disclosure simplifies the manufacturing process of the phase change memory, and reduces the manufacturing cost, and improves the manufacturing yield. In addition, the contact area between the heater and the phase change layer of the phase change memory of the present disclosure is very small, so that the phase change memory has an extremely low reset current, thus to effectively solve the problems described in the prior art.

The features of several embodiments described above enable those skilled in the art to better understand the aspects of the present disclosure. Those skilled in the art will appreciate that the present disclosure may be readily utilized as a basis for designing or modifying other processes and structures to achieve the same objectives and/or achieve the same advantages of the embodiments described herein. It will be appreciated by those skilled in the art that such equivalent structures may be made without departing from the spirit and scope of the present disclosure, and various changes, substitutions and alterations herein may be made without departing from the spirit and scope of the present disclosure.

What is claimed is:

1. A phase change memory, comprising:
a lower electrode;
an annular heater disposed over the lower electrode;
an annular phase change layer disposed over the annular heater, wherein the annular phase change layer and the annular heater are misaligned in a normal direction of the lower electrode;
a filling layer, wherein the annular phase change layer has a hollow portion, and the filling layer is filled in the hollow portion, and an upper surface of the filling layer is coplanar with the upper surface of the annular phase change layer; and
an upper electrode disposed over the annular phase change layer, wherein the upper electrode is in contact with an upper surface of the annular phase change layer.

2. The phase change memory of claim 1, wherein the lower electrode is integrally formed with the annular heater.

3. The phase change memory of claim 1, further comprising a flat layer, wherein the annular heater has a hollow portion, and the flat layer is filled in the hollow portion, and an upper surface of the flat layer is coplanar with an upper surface of the annular heater.

4. The phase change memory of claim 3, wherein the flat layer has an electrical resistance higher than an electrical resistance of the annular heater.

5. The phase change memory of claim 1, further comprising an annular spacer surrounding an outer side of the annular heater, and an upper surface of the annular spacer is coplanar with an upper surface of the annular heater.

6. The phase change memory of claim 1, further comprising a barrier layer covering a bottom of the lower electrode and an outer side surface of the annular heater, and an upper surface of the barrier layer is coplanar with an upper surface of the annular heater.

7. The phase change memory of claim 6, wherein the barrier layer has an electrical resistance higher than an electrical resistance of the annular heater.

8. The phase change memory of claim 1, wherein a material of the filling layer is an alloy material having an electrical resistance higher than an electrical resistance of the annular phase change layer.

9. A method of fabricating a phase change memory, comprising:
providing a precursor structure, the precursor structure comprising a first dielectric layer having a first opening;
forming a lower electrode and an annular heater in the first opening, wherein the annular heater is disposed over the lower electrode;
forming an annular phase change layer over the annular heater, wherein the operation of forming the annular phase change layer comprises forming a second dielectric layer over the annular heater, wherein the second dielectric layer has a second opening, forming the annular phase change layer in the second opening and forming a dielectric layer in a remaining portion of the second opening, wherein the annular phase change layer and the annular heater are misaligned in a normal direction of the lower electrode; and
forming an upper electrode over the annular phase change layer, wherein the upper electrode is in contact with an upper surface of the annular phase change layer.

10. The method of claim 9, wherein the operation of forming the lower electrode and the annular heater comprises:
forming a conductive material over the first dielectric layer, and a sidewall and a lower surface of the first opening; and
performing a chemical-mechanical polishing process to remove the conductive material over the first dielectric layer and an upper portion of the first dielectric layer to form the lower electrode and the annular heater.

11. The method of claim 9, before the operation of forming the lower electrode and the annular heater, further comprising:
forming an annular spacer over a sidewall of the first opening.

12. The method of claim 9, before the operation of forming the lower electrode and the annular heater, further comprising:
forming a barrier layer over a bottom and a sidewall of the first opening.

13. The method of claim 9, wherein the lower electrode is integrally formed with the annular heater.

14. The method of claim 9, before the operation of forming the annular phase change layer, further comprising:
forming a flat layer in a remaining portion of the first opening.

15. The method of claim 9, wherein the operation of forming the annular phase change layer in the second opening comprises:
forming a phase change layer material over the second dielectric layer, and a sidewall and a lower surface of the second opening; and
performing an etching process to remove the phase change layer material over the second dielectric layer and the phase change layer material over the lower surface of the second opening to form the annular phase change layer.

* * * * *